United States Patent
Park et al.

(10) Patent No.: US 11,948,891 B2
(45) Date of Patent: Apr. 2, 2024

(54) SEMICONDUCTOR PACKAGE AND MANUFACTURING METHOD THEREOF

(71) Applicant: NEPES CO., LTD., Eumseong-gun (KR)

(72) Inventors: Sang Yong Park, Sejong-si (KR); Juhyun Nam, Cheongju-si (KR)

(73) Assignee: NEPES CO., LTD., Eumseong-gun (KR)

( * ) Notice: Subject to any disclaimer, the term of this patent is extended or adjusted under 35 U.S.C. 154(b) by 177 days.

(21) Appl. No.: 17/219,956

(22) Filed: Apr. 1, 2021

(65) Prior Publication Data

US 2021/0313274 A1    Oct. 7, 2021

(30) Foreign Application Priority Data

Apr. 3, 2020 (KR) .................. 10-2020-0040678
Jul. 9, 2020 (KR) .................. 10-2020-0084428

(Continued)

(51) Int. Cl.
*H01L 23/538* (2006.01)
*H01L 23/00* (2006.01)
(Continued)

(52) U.S. Cl.
CPC ........ *H01L 23/5389* (2013.01); *H01L 23/552* (2013.01); *H01L 24/24* (2013.01);
(Continued)

(58) Field of Classification Search
CPC ....... H01L 24/25; H01L 24/24; H01L 23/552; H01L 25/16; H01L 23/5389; H01L 23/538
(Continued)

(56) References Cited

U.S. PATENT DOCUMENTS

| 8,691,600 | B2 | 4/2014 | Liu |
| 10,388,612 | B2 | 8/2019 | Lin et al. |

(Continued)

FOREIGN PATENT DOCUMENTS

| KR | 10-2006-0043439 | 5/2006 |
| KR | 10-2012-0101965 | 9/2012 |

(Continued)

OTHER PUBLICATIONS

Office Action issued in Corresponding Taiwanese Application No. 110112150, dated Feb. 21, 2022 (No English translation provided).

(Continued)

*Primary Examiner* — Tremesha S Willis
(74) *Attorney, Agent, or Firm* — NORTON ROSE FULBRIGHT US LLP

(57) ABSTRACT

A semiconductor package is provided. The semiconductor package can include a first redistributed layer on which a plurality of semiconductor chips and a plurality of passive devices are mounted on one surface, a second redistributed layer electrically connected to the first redistributed layer through a via, an external connection terminal formed on the lower surface of the second redistributed layer, a first mold provided to cover the plurality of semiconductor chips and the plurality of passive devices on the first redistributed layer, and a second mold provided between the first redistributed layer and the second redistributed layer. Each of the first redistributed layer and the second redistributed layer includes a wiring pattern and an insulating layer and is composed of a plurality of layers, and at least one of the plurality of semiconductor chips is disposed between the first redistributed layer and the second redistributed layer.

6 Claims, 16 Drawing Sheets

(30) Foreign Application Priority Data

Dec. 3, 2020 (KR) ........................ 10-2020-0167204
Mar. 17, 2021 (KR) ........................ 10-2021-0034710
Mar. 25, 2021 (KR) ........................ 10-2021-0039103

(51) Int. Cl.
*H01L 23/552* (2006.01)
*H01L 25/16* (2023.01)

(52) U.S. Cl.
CPC .............. *H01L 24/25* (2013.01); *H01L 24/73* (2013.01); *H01L 24/92* (2013.01); *H01L 25/16* (2013.01); *H01L 2224/24011* (2013.01); *H01L 2224/2402* (2013.01); *H01L 2224/24137* (2013.01); *H01L 2224/24146* (2013.01); *H01L 2224/24227* (2013.01); *H01L 2224/24265* (2013.01); *H01L 2224/2518* (2013.01); *H01L 2224/73267* (2013.01); *H01L 2224/92244* (2013.01)

(58) Field of Classification Search
USPC ......................................... 361/782
See application file for complete search history.

(56) References Cited

U.S. PATENT DOCUMENTS

| | | |
|---|---|---|
| 2008/0073747 A1 | 3/2008 | Chao et al. |
| 2015/0155203 A1 | 6/2015 | Chen et al. |
| 2017/0062391 A1* | 3/2017 | Chen ........................ H01L 24/20 |
| 2017/0278836 A1 | 9/2017 | Kilger |

FOREIGN PATENT DOCUMENTS

| | | |
|---|---|---|
| KR | 2014011936 | 9/2014 |
| KR | 10-2016-0093390 | 8/2016 |
| KR | 10-2016-0132053 | 11/2016 |
| KR | 10-2017-0106479 | 9/2017 |
| KR | 10-2017-0107318 | 9/2017 |
| KR | 10-2018-0101131 | 9/2018 |
| KR | 10-2019-0055709 | 5/2019 |
| TW | 201336040 | 9/2013 |
| TW | 201907521 | 2/2019 |
| TW | 201919190 | 5/2019 |
| TW | 201944869 | 11/2019 |
| TW | 202006838 | 2/2020 |

OTHER PUBLICATIONS

Office Action issued in corresponding Korean Application No. 10-2021-0034710, dated Jan. 6, 2023. (With English Machine Translation).

Office Action issued in corresponding Korean Application No. 10-2021-0039103, dated Jan. 17, 2023. (With English Machine Translation).

Office Action issued in corresponding Korean Application No. 10-2021-0039103, dated Jun. 26, 2023.

* cited by examiner (a)

(b)

(c)

SEMICONDUCTOR PACKAGE AND MANUFACTURING METHOD THEREOF

CROSS-REFERENCE TO RELATED APPLICATION

This application claims priority to and the benefit of Korean Patent Application No. 10-2020-0040678, filed on Apr. 3, 2020, Korean Patent Application No. 10-2020-0084428, filed on Jul. 9, 2020, Korean Patent Application No. 10-2020-0167204, filed on Dec. 3, 2020, Korean Patent Application No. 10-2021-0034710, filed on Mar. 17, 2021, and Korean Patent Application No. 10-2021-0039103, filed on Mar. 25, 2021, the disclosures of which are incorporated herein by reference in their entirety.

FIELD OF THE DISCLOSURE

The present invention relates to a semiconductor package and a manufacturing method thereof, and more specifically, the present invention relates to a system-in-package semiconductor package and a manufacturing method thereof.

DESCRIPTION OF RELATED ART

The System-in-Package (SiP) operating as one system includes a plurality of semiconductor chips. In this case, the SiP may use a redistributed layer (RDL) and include a plurality of semiconductor chips as well as passive devices. Herein, in the SiP, semiconductor chips or passive devices may be vertically stacked or horizontally arranged, and may be connected by bumps or wire bonds.

However, SiP increases input/output as a plurality of semiconductor chips and passive devices are integrated, and as the package becomes smaller, requirement matters are increasing for electrical factors such as electromagnetic blocking, processing speed, RF performance, and the like, as well as structural factors such as fine pitch or wire length.

SUMMARY OF THE INVENTION

In order to solve the problems of the prior art as described above, an exemplary embodiment of the present invention is to provide a semiconductor package capable of miniaturizing and improving electrical characteristics while implementing SiP, and a manufacturing method thereof.

However, the problems to be solved by the present invention are not limited to the problem mentioned above, and other problems that are not mentioned will be clearly understood by those skilled in the art from the following description.

According to an aspect of the present invention for solving the above problems, the semiconductor package of the present invention may include a redistributed layer including an insulating layer and a wiring pattern, a plurality of semiconductor chips disposed on both upper and lower portions of the redistributed layer; and a mold provided to cover the plurality of semiconductor chips on the upper portion of the redistributed layer, wherein the redistributed layer may be composed of a plurality of layers.

In an exemplary embodiment, a wiring pattern disposed at the uppermost portion may be not covered by the insulating layer.

In an exemplary embodiment, a coating layer made of polyimide on the upper surface of the mold may be further included.

In an exemplary embodiment, a part of the wiring pattern on the lower side may be exposed to the lower side, and the uppermost wiring pattern or the lowermost wiring pattern among the wiring patterns may be covered with an oxide layer by black oxidation.

In an exemplary embodiment, a shield layer provided along the outer surface of the mold may be further included.

In an exemplary embodiment, the redistributed layer may be formed to extend such that a part of at least one wiring pattern is connected to the shield layer.

In an exemplary embodiment, the insulating layer may have a dielectric constant (Dk) of 2 to 3 and a dissipation factor of 0.002 to 0.005.

In an exemplary embodiment, in the wiring pattern of the redistributed layer, the wiring pattern located at the upper portion and the wiring pattern located at the lower portion may have a thicker thickness than the central wiring pattern located at the center.

The semiconductor package according to another aspect of the present invention may include a first redistributed layer on which a plurality of semiconductor chips and a plurality of passive devices are mounted on one surface, a second redistributed layer electrically connected to the first redistributed layer through a via, an external connection terminal formed on a lower surface of the second redistributed layer, a first mold provided on the first redistributed layer to cover the plurality of semiconductor chips and the plurality of passive devices, and a second mold provided between the first redistributed layer and the second redistributed layer, wherein each of the first redistributed layer and the second redistributed layer may include a wiring pattern and an insulating layer and may be composed of a plurality of layers, and wherein at least one of the plurality of semiconductor chips may be disposed between the first redistributed layer and the second redistributed layer.

In an exemplary embodiment, a coating layer made of polyimide on the upper surface of the mold may be further included.

In an exemplary embodiment, the via may be formed seamlessly with an integral linear structure on a plane.

In an exemplary embodiment, a shield layer provided along the outer surface of the mold may be further included.

In an exemplary embodiment, a part of at least one wiring pattern among the first redistributed layer and the second redistributed layer may be formed to extend so as to be connected to the shield layer.

In an exemplary embodiment, the shield layer may be formed to extend toward the external connection terminal.

In an exemplary embodiment, the insulating layer may have a dielectric constant (Dk) of 2 to 3 and a dissipation factor of 0.002 to 0.005.

In an exemplary embodiment, in the wiring pattern of the first redistributed layer, the wiring pattern located at the upper portion and the wiring pattern located at the lower portion may have a thicker thickness than the central wiring pattern located at the center.

In an exemplary embodiment, each of the first redistributed layer and the second redistributed layer may include a wiring pattern and an insulating layer and may be composed of a plurality of layers, and the number of layers of the first redistributed layer may be more than the number of layers of the second redistributed layer.

In an exemplary embodiment, a semiconductor chip mounted on the first redistributed layer may be an analog block, and a semiconductor chip mounted between the first redistributed layer and the second redistributed layer may be a digital block.

In an exemplary embodiment, the semiconductor package according to the present invention may include a first redistributed layer on which a plurality of semiconductor chips or a plurality of passive devices are mounted on both surfaces, a first mold provided to cover the plurality of semiconductor chips or the plurality of passive devices at the upper portion of the first redistributed layer, a second mold provided to cover the plurality of semiconductor chips at the lower portion of the first redistributed layer, a connection pad provided under the second mold and connected to the first redistributed layer through a via formed in the second mold, a heat dissipation pad provided on an exposed surface of a semiconductor chip provided under the first redistributed layer, and an external input terminal connected to the connection pad and the heat dissipation pad, wherein the first redistributed layer may include a wiring pattern and an insulating layer and may be composed of a plurality of layers, and wherein the connection pad and the heat dissipation pad may be made of a thermally conductive material.

The method for manufacturing a semiconductor package according to another aspect of the present invention may include forming a second redistributed layer including multiple layers of a second insulating layer and a second wiring pattern, forming a via extending from a portion of a wiring pattern of the second redistributed layer, bonding a semiconductor chip to one surface of the second redistributed layer using an adhesive layer, forming a second mold on an upper surface of the second redistributed layer, wherein one surface of the via and a chip pad of the semiconductor chip are exposed, forming a first redistributed layer including multiple layers of a first insulating layer and a first wiring pattern on an upper surface of the second mold, wherein a part of the first wiring pattern is electrically connected to the semiconductor chip and the via, mounting a plurality of first semiconductor chips and a plurality of passive devices on the first redistributed layer, forming a first mold on the first wiring pattern of the first redistributed layer to cover the first semiconductor chip and the passive device, forming an external connection terminal on the second redistributed layer, and forming a shield layer along the outer surface of the first mold.

The semiconductor package according to an exemplary embodiment of the present invention may implement high-speed signal and RF trace functions, by using a low dielectric constant (Dk) and dissipation factor (Df) material, and an embedded trace substrate (ETS).

In addition, by excluding the uppermost insulating layer or a UBM layer from a redistributed layer, the present invention can reduce the cost for forming an insulating layer or a UBM layer, and simplify the corresponding process.

In addition, by omitting a part of the redistributed layer and attaching a heat dissipation pad to one surface of the semiconductor chip, the present invention can improve heat dissipation characteristics, because heat generated by the semiconductor chip can be easily discharged to the outside.

In addition, by providing a semiconductor chip on the lower surface of a redistributed layer, the present invention can perform a high-speed processing because the wiring of the semiconductor chip is shortened.

DETAILED DESCRIPTION OF THE INVENTION

Figure 1:
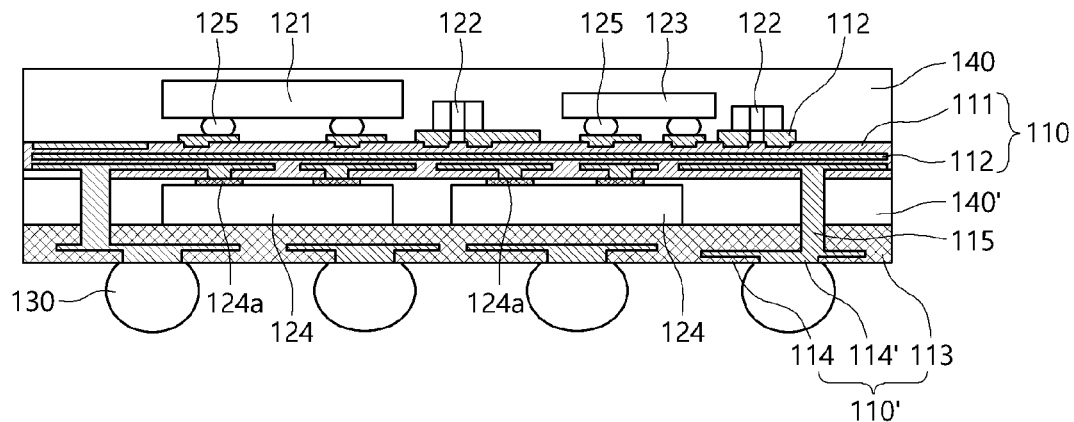
FIG. 1 is a cross-sectional view of a semiconductor package according to a first example of the present invention.

Hereinafter, exemplary embodiments of the present invention will be described in detail with reference to the accompanying drawings such that those of ordinary skill in the art may easily implement the present invention. The present invention may be implemented in various different forms and is not limited to the exemplary embodiments described herein. In the drawings, parts irrelevant to the description are omitted in order to clearly describe the present invention, and the same reference numerals are assigned to the same or similar components throughout the specification.

The exemplary embodiments of the present invention are provided to describe the present invention more completely to those of ordinary skill in the art, the exemplary embodiments described below may be modified in various other forms, and the scope of the present invention is not limited to the following exemplary embodiments. Rather, these exemplary embodiments are provided to make the present invention more meaningful and complete, and to fully convey the spirit of the present invention to those skilled in the art.

Hereinafter, exemplary embodiments of the present invention will be described with reference to the drawings schematically illustrating the exemplary embodiments of the present invention. In the drawings, for example, depending on manufacturing techniques and/or tolerances, variations of the illustrated shape may be expected. Therefore, the exemplary embodiments of the present invention should not be construed as being limited to the specific shape of the region illustrated in the present specification, but should include, for example, a change in shape caused by manufacturing.

FIG. 1 is a cross-sectional view of a semiconductor package according to a first example of the present invention.

The semiconductor package 100 according to the first example includes redistributed layers 110 and 110', semiconductor chips 121, 123 and 124, passive devices 122, an external connection terminal 130, and molds 140 and 140'.

Herein, as SiP, the semiconductor package 100 has a double-sided redistribution structure, a plurality of redistributed layers, and a multichip structure including heterogeneous semiconductor chips. That is, the semiconductor package 100 may include a plurality of semiconductor chips 121, 123, and 124. Moreover, the semiconductor package 100 may include a plurality of passive devices 122.

A thin profile and a fine pitch structure are applied to the redistributed layers 110 and 110'. The thickness of the redistributed layers 110 and 110' may be 2 μm to 15 μm. The redistributed layers 110 and 110' may include a first redistributed layer 110 and a second redistributed layer 110'.

The semiconductor chips 121 and 123 and the passive device 122 may be mounted on one surface of the first redistributed layer 110. Herein, the first redistributed layer 110 may include an insulating layer 111 and a wiring pattern 112. The line and space patterns of the wiring pattern 112 may be set to be 1 μm to 10 μm. Moreover, the first redistributed layer 110 may be a redistribution substrate. In this case, the redistribution substrate may be a thin-film profile and a fine pitch substrate.

Moreover, semiconductor chips 121, 123, and 124 may be mounted on both surfaces of the first redistributed layer 110. In this case, the semiconductor chips 121 and 123 may be provided above the first redistributed layer 110, and the semiconductor chip 124 may be provided below the first redistributed layer 110. Herein, the semiconductor chips 121 and 123 may be analog semiconductor chips, and the semiconductor chip 124 may be a digital semiconductor chip. However, the present invention is not limited thereto, and the semiconductor chips 121 and 123 may be digital semiconductor chips, and the semiconductor chip 124 may be an analog semiconductor chip.

In this case, the first redistributed layer 110 may be constituted by three layers of the wiring pattern 112. Accordingly, the overall thickness of the semiconductor package 100 may be reduced, thereby achieving miniaturization.

The insulating layer 111 may be made of a low dielectric constant (Dk) and dissipation factor Df) material. Accordingly, the semiconductor package 100 may be utilized for high-speed RF signal transmission. Specifically, the dielectric constant (Dk) of the insulating layer 111 may be set to 1.5 to 3.5, and the dissipation factor (Df) may be set to 0.001 to 0.006.

In this case, the insulating layer 111 may be formed of an insulating polymer, epoxy, a silicon oxide film, a silicon nitride film (SiN), or a combination thereof. In addition, the insulating layer 111 may be made of a non-photosensitive material or a photosensitive material. For example, the insulating layer 111 may be made of polyimide (PI).

Herein, the insulating polymer may include a general-purpose polymer such as polymethylmethacrylate (PMMA), polystyrene (PS), polybenzoxazoles (PBO), and the like, an acrylic polymer, an imide polymer (polyimide (PI)), an aryl ether polymer, an amide polymer, a fluorine polymer, a p-xylene polymer, a vinyl alcohol polymer, a polymer derivative having a phenol group, or a combination thereof.

A plurality of insulating layers 111 may be provided on each upper side of the wiring pattern 112. However, the insulating layer 111 may be provided such that the wiring pattern 112 disposed on the upper side is exposed.

Accordingly, the passive device 122 and the semiconductor chip 121 may be directly mounted on the exposed wiring pattern 112. In this case, the passive device 122 and the semiconductor chip 121 may be mounted on the wiring pattern 112 through soldering.

In this way, by excluding the uppermost insulating layer from the first redistributed layer 110, the semiconductor package 100 may reduce the manufacturing cost and simplify the process.

The wiring pattern 112 may be a pattern for electrically connecting the upper and lower surfaces of the first redistributed layer 110. To this end, the wiring pattern 112 may be made of a conductive material. Herein, the wiring pattern 112 may be formed of W, Cu, Zr, Ti, Ta, Al, Ru, Pd, Pt, Co, Ni, or a combination thereof. For example, the wiring pattern 112 may be made of Cu.

The first redistributed layer 110 and the second redistributed layer 110' may be electrically connected through a 3D via 115. In this case, the 3D via 115 may have a high aspect ratio.

The second redistributed layer 110' may include an insulating layer 113, a wiring pattern 114, and a connection pad area 114'. The insulating layer 113 and the wiring pattern 114 may be formed in the same manner as the insulating layer 111 and the wiring pattern 112.

That is, the first redistributed layer 110 and the second redistributed layer 110' may have a multilayer structure including a plurality of insulating layers 113 and a plurality of wiring patterns 114, respectively, and in this case, the number of layers of the first redistributed layer 110 may be more than the number of layers of the second redistributed layer 110'.

As such, the difference between the first redistributed layer 110 and the second redistributed layer 110' is a structure in which a plurality of passive devices 122 and semiconductor chips 121 are included in the first redistributed layer 110, and it becomes a structure in which the passive device 122 and the semiconductor chips 121 are connected to the wiring pattern 112 of the first redistributed layer 110.

Accordingly, the first redistributed layer 110 has a higher degree of integration than the second redistributed layer 110', and includes a larger number of layers.

For example, the first redistributed layer 110 may be in a range of 3 to 15 layers, and preferably, 3 to 7 layers.

In this regard, the second redistributed layer 110' may be formed in a number of 2 to 5 layers, and preferably, it may be formed in a two-layer or three-layer structure.

In addition, the wiring pattern 112 of the first redistributed layer 110 may be arranged in multiple layers, and each layer may have a different thickness.

In particular, the uppermost and lowermost wiring patterns 112 are formed to be relatively thicker than the wiring patterns disposed between the uppermost and lowermost portions.

As described above, since the uppermost insulating layer or UBM layer is not included, it may be formed to be thicker than other wiring patterns disposed in the center so as to perform the role of the UBM layer.

For example, in the multilayer wiring pattern 112, the uppermost and lowermost wiring patterns may be formed in a range of 1 μm to 100 μm, and a thickness of 5 to 30 μm is preferable.

In this regard, the thickness of the wiring pattern between the uppermost portion and the lowermost portion may be formed in a range of 0.1 μm to 30 μm, and is preferably formed to have a thickness of 1 μm to 15 μm.

The connection pad area 114' may be formed to be exposed from the lower surface of the second redistributed layer 110'. The connection pad area 114' is for connecting the external connection terminal 130 to the second redistributed layer 110'. The connection pad area 114' may be formed by vapor deposition or sputtering. In this case, the connection pad area 114' may be formed of Cr/Cr-Cu/Cu, Ti-W/Cu, or Al/Ni-v/Cu.

The connection pad area 114' may be connected to the 3D via 115 through a wiring pattern. In addition, the connection pad area 114' may be provided with an external connection terminal 130 under the connection pad area 114'.

Meanwhile, the redistributed layers 110 and 110' may be formed of a plurality of layers. That is, the redistributed layers 110 and 110' may include a plurality of layers of insulating layers 111 and 113 and wiring patterns 112 and 114 according to the type and quantity of the semiconductor chips 121, 123, and 124.

The semiconductor chips 121, 123, and 124 may include digital chips or analog chips. Further, the semiconductor chips 121, 123, and 124 may include a logic chip or a memory chip such as system large-scale integration (LSI). Herein, the semiconductor chip 121 may be an analog semiconductor chip, and the semiconductor chip 123 may be a digital semiconductor chip. However, the present invention is not limited thereto, and the semiconductor chip 121 may be a digital semiconductor chip, and the semiconductor chip 123 may be an analog semiconductor chip.

The third semiconductor chip 124 may be provided on a surface of the first redistributed layer 110 facing the semiconductor chips 121 and 123. That is, the third semiconductor chip 124 may be provided between the first redistributed layer 110 and the second redistributed layer 110'. In addition, the semiconductor chip 124 may be connected to the wiring pattern 112 of the first redistributed layer 110 through a chip pad 124a. Herein, a second mold 140' may be provided between the first redistributed layer 110 and the second redistributed layer 110' to surround the semiconductor chip 124.

The passive device 122 may be a device for operating or assisting the function of the semiconductor chips 121, 123, 124. The passive device 122 may include a resistor, a capacitor, and a coil. In addition, the passive device 122 may be an integrated passive device (IPD). Herein, the passive device 122 may be any one of a balun, a filter, a coupler, and a diplexer, but is not limited thereto.

In this case, the interval between the semiconductor chips 121 and 123 and the passive device 122 may be a minimum of 50 μm to a maximum of 150 μm, and a preferred range of the interval is 75 μm to 150 μm. The semiconductor chips 121 and 123 and the passive device 122 may be mounted on the first redistributed layer 110 through a solder 125. Herein, the semiconductor chips 121 and 123 and the passive device 122 may be mounted on the wiring pattern 112 from which the insulating layer 111 is removed.

The external connection terminal 130 may be a terminal for signal input or signal output of the semiconductor package 100. That is, the external connection terminal 130 may be a connection terminal for mounting the semiconductor package 100 on a board such as a printed circuit board and the like.

The external connection terminal 130 may be formed on the lower surface of the connection pad area 114'. Accordingly, the external connection terminal 130 may be electrically connected to the semiconductor chips 121 and 123 or the passive device 122 through the connection pad area 114' and the wiring pattern 112.

The external connection terminal 130 may include a solder bump. Herein, the external connection terminal 130 may include Sn, Au, Ag, Ni, In, Bi, Sb, Cu, Zn, Pb, or a combination thereof, but is not limited thereto. For example, the solder may be made of the Sn—Ag—Cu (SAC) series. In this case, the solder bump may have a ball shape.

The molds 140 and 140' may include a first mold 140 and a second mold 140'.

The first mold 140 may be provided on the first redistributed layer 110 to cover the plurality of semiconductor chips 121 and 123 and the plurality of passive devices 122. Herein, the first mold 140 may be made of epoxy resin. In this case, the first mold 140 may be formed by the vacuum printing encapsulation system (VPES).

The second mold 140' may be provided so as to surround the semiconductor chip 124 between the first redistributed layer 110 and the second redistributed layer 110'. When the 3D via 115 is formed using a laser, the second mold 140' may be an epoxy mold compound (EMC) for laser direct structuring (LDS). Optionally, the second mold 140' may be formed of the same material as the first mold 140.

Figure 2:
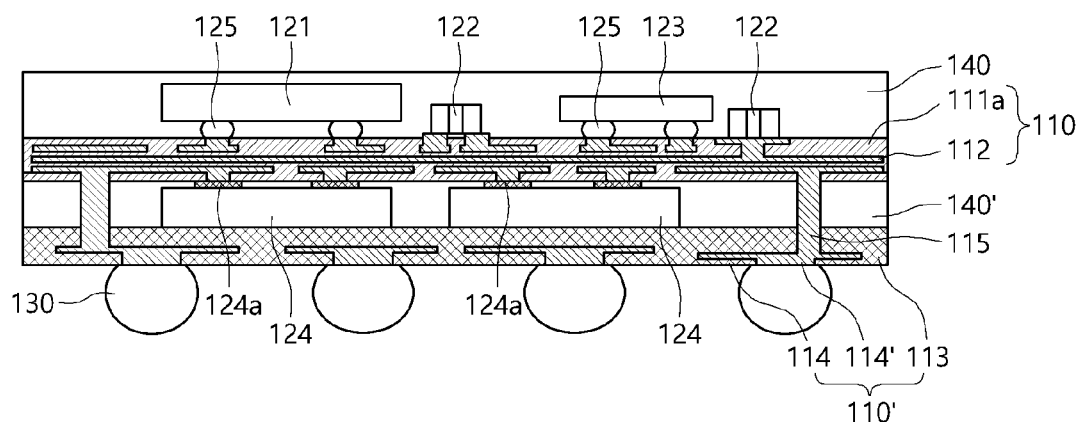
FIG. 2 is a cross-sectional view of a semiconductor package according to a first modification example of the present invention.

FIG. 2 is a cross-sectional view of a semiconductor package according to a first modification example of the present invention.

Compared to the semiconductor package 100 of FIG. 1, the semiconductor package 100-1 according to the first modification example has a structure in which a wiring pattern 112 is provided not to be exposed to the outside except for a part thereof, and a semiconductor chip 121 and a passive device 122 are mounted on the partially exposed wiring patter 112. Since the constitutions other than the above are the same as those of the semiconductor package 100 of FIG. 1, the detailed description thereof will be omitted.

In this case, the semiconductor package 100-1 may be provided such that an additional insulating layer 111a covers the wiring pattern 112 provided on the upper side. Herein, the semiconductor chip 121 and the passive device 122 may be mounted on the wiring pattern 112 from which the insulating layer 111a is removed. That is, the insulating layer 111a may be provided to cover the wiring pattern 112 provided on the upper side except for positions corresponding to the semiconductor chip 121 and the passive device 122.

As such, the first redistributed layer 110 may be an embedded trace substrate (ETS). Accordingly, the first redistributed layer 110 may implement high-speed signal and RF trace functions.

Figure 3:
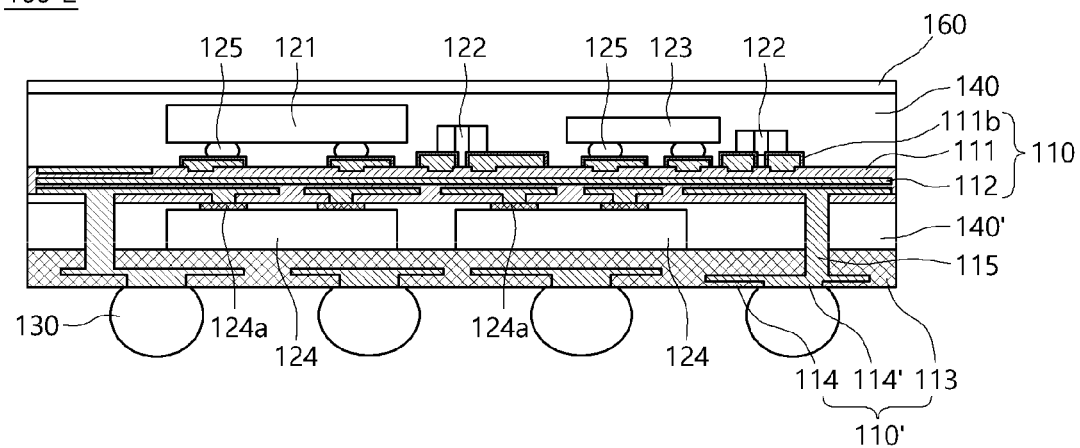
FIG. 3 is a cross-sectional view of a semiconductor package according to a second modification example of the present invention.

FIG. 3 is a cross-sectional view of a semiconductor package according to a second modification example of the present invention.

Compared to the semiconductor package 100 of the first example, the semiconductor package 100-2 according to the second modification example performs black oxidation on a wiring pattern 112 exposed to the outside, and then, it has a structure in which a semiconductor chip 121 and a passive device 122 are mounted on the wiring pattern 112. Since the constitutions other than the above are the same as those of the semiconductor package 100 of FIG. 1, the detailed description thereof will be omitted.

In addition, a coating layer 160 may be further included above a mold 140. The coating layer 160 may be made of polyimide (PI), and it may be controlled to reduce warpage of a substrate due to an increase in redistribution such that handling of the substrate during a manufacturing process may be improved.

Although it is illustrated that the coating layer 160 is included in the following modification examples, it may be certainly modified to a structure in which the coating layer 160 is omitted.

Herein, the semiconductor package 100-2 according to the second modification example is illustrated and described as being based on the semiconductor package 100 of the first example, but is not limited thereto, and it may be certainly applied to a semiconductor package according to another modification example.

More specifically, the first redistributed layer 110 may include an insulating layer 111, a wiring pattern 112, and a connection pad area 114', and the upper wiring pattern 112 may be exposed above the insulating layer 111.

In this case, the semiconductor package 100-2 according to the second modification example may be provided with an oxide layer 111b on the exposed wiring pattern 112. Herein, the oxide layer 111b may be formed by black oxidation. The oxide layer 111b generated by black oxidation may include copper oxide such as $CuO$, $Cu_2O$, and the like, when the wiring pattern 112 is formed of Cu. As such, the oxide layer 111b may be removed from a portion where the passive device 122 and the semiconductor chip 121 are connected through a solder 125.

That is, the semiconductor package 100-2 may have a structure in which the oxide layer 111b is formed on the exposed wiring pattern 112 by black oxidation, instead of the insulating layer 111 which is provided at the uppermost portion included in the first redistributed layer 110.

Accordingly, the passive device 122 or the semiconductor chips 121 and 123 may be directly mounted on the exposed wiring pattern 112. In this case, the passive device 122 and the semiconductor chips 121 and 123 may be mounted on the wiring pattern 112 through soldering.

In this way, by excluding the uppermost insulating layer from the first redistributed layer 110, the semiconductor package 100-2 may reduce the cost and simplify the process.

Figure 4:
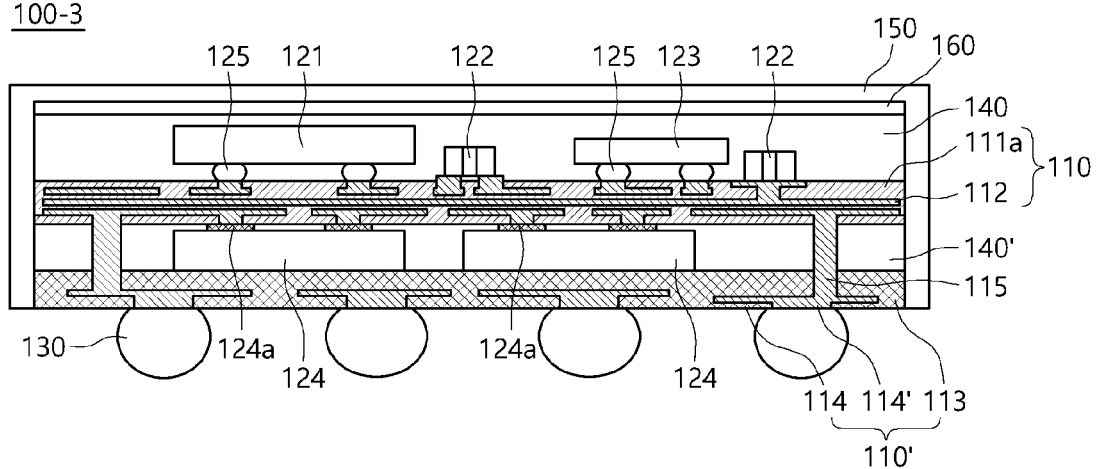
FIG. 4 is a cross-sectional view of a semiconductor package according to a third modification example of the present invention.

FIG. 4 is a cross-sectional view of a semiconductor package according to a third modification example of the present invention.

Compared to the semiconductor package 100-1 of the first example, the semiconductor package 100-3 according to the third modification example has a structure in which a shield layer 150 is provided along the outer surface of a first mold 140. Since the constitutions other than the above are the same as those of the semiconductor package 100-1 of the first modification example, the detailed description thereof will be omitted.

Herein, the semiconductor package 100-3 according to the third modification example is illustrated and described as being based on the semiconductor package 100-1 of the first modification example, but is not limited thereto, and it may be certainly applied to the semiconductor packages according to the first example and other modification examples.

More specifically, the shield layer 150 may be provided to extend to the side surfaces of the redistributed layers 110 and 110'. Moreover, the shield layer 150 may be formed to extend from the side surface of the semiconductor package 100-3 to a second mold 140'. That is, the shield layer 150 may be provided along the outer surface of the first mold 140 and may be provided to extend to the side surfaces of the first redistributed layer 110 and the second redistributed layer 110'. The shield layer 150 may have an electromagnetic interference (EMI) shielding function.

For example, the shield layer 150 may be made of a metal material capable of shielding electromagnetic waves. As another example, the shield layer 150 may be made of a material capable of absorbing a specific electromagnetic wave. For example, the shield layer 150 may be made of ferrite.

In this case, the shield layer 150 may be formed by a sputter process using a metal seed. Optionally, the shield layer 150 may be formed by the SMT process using a metal can. Further, the shield layer 150 may be omitted by configuring the first mold 140 with an electromagnetic wave absorbing material such as ferrite.

Figure 5:
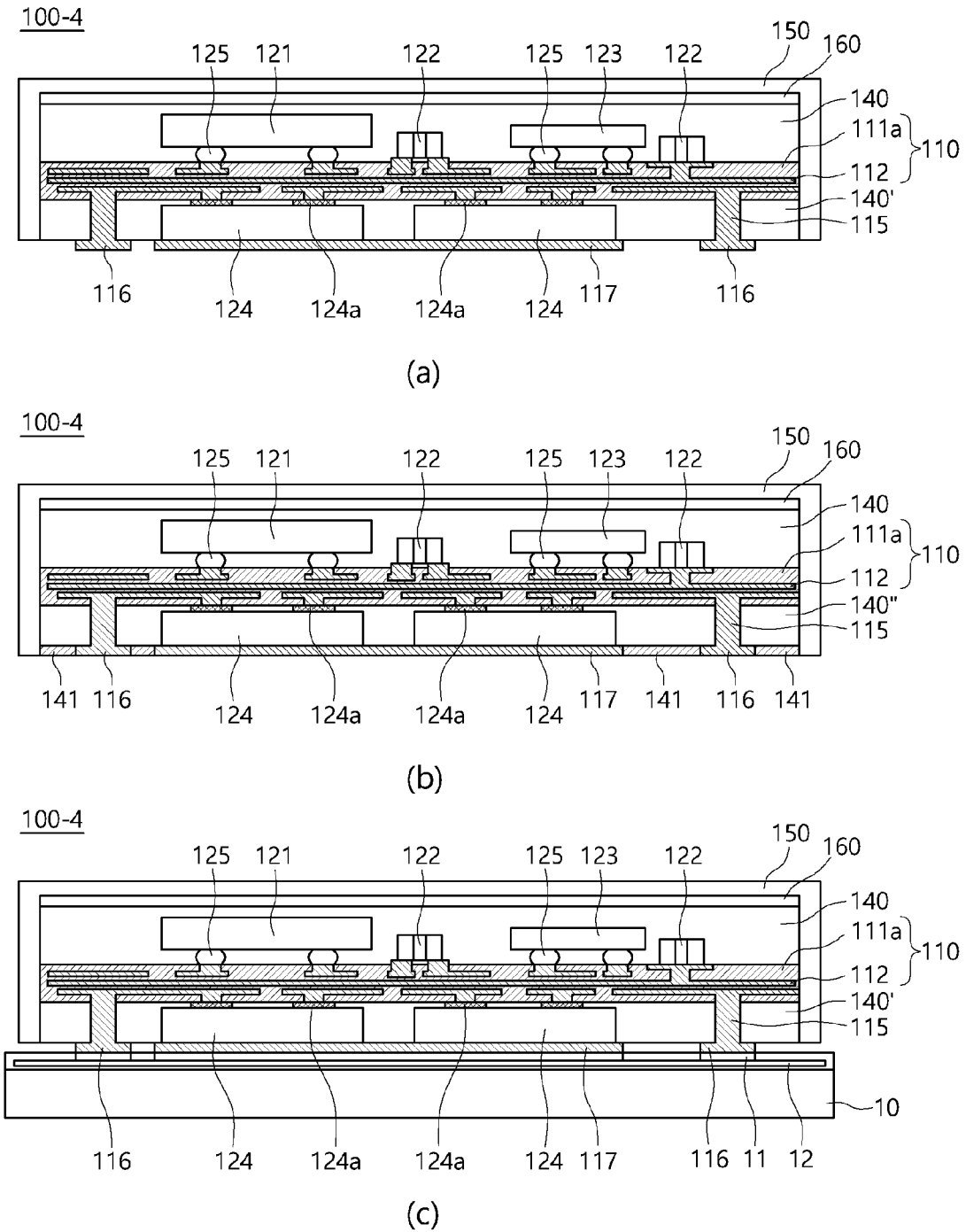
FIG. 5 is a semiconductor package according to a fourth modification example of the present invention, (a) is a cross-sectional view of the fourth modification example, (b) is a cross-sectional view of a state in which a mold is additionally filled in the fourth modification example, and (c) is a cross-sectional view of a state in which the fourth modification example is mounted on a printed circuit board.

FIG. 5 is a semiconductor package according to a fourth modification example of the present invention, (a) is a cross-sectional view of the fourth modification example, (b) is a cross-sectional view of a state in which a mold is additionally filled in the fourth modification example, and (c) is a cross-sectional view of a state in which the fourth modification example is mounted on a printed circuit board.

Compared to the semiconductor package 100-1 of the first modification example, the semiconductor package 100-4 according to the fourth modification example has a structure in which the second redistributed layer 110' is omitted, and the connection pad 116 and the heat dissipation pad 117 are provided. Since the constitutions other than the above are the same as those of the semiconductor package 100-1 of the first modification example, the detailed description thereof will be omitted.

Herein, the semiconductor package 100-4 according to the fourth modification example is illustrated and described as being based on the semiconductor package 100-1 of the first modification example, but is not limited thereto, and it may be certainly applied to the semiconductor packages according to the first example and other modification examples.

More specifically, as illustrated in (a) of FIG. 5, in the semiconductor package 100-4 according to the fourth modification example, a 3D via 115 and one surface of a semiconductor chip 124 may be exposed. Herein, the connection pad 116 may be provided on the exposed surface of the 3D via 115. In addition, a heat dissipation pad 117 may be provided on the exposed surface of the semiconductor chip 124. Herein, the connection pad 116 and the heat dissipation pad 117 may be made of a material having excellent thermal conductivity.

Accordingly, the semiconductor package of (a) in FIG. 5 may improve the heat dissipation effect while using a minimum space.

As illustrated in (b) of FIG. 5, in the semiconductor package 100-4, a mold 141 may be filled between the connection pad 116 and the heat dissipation pad 117. Herein, the mold 141 may be made of the same material as the molds 140 and 140'.

Accordingly, the semiconductor package of (b) in FIG. 5 may prevent damage to the connection pad 116 and the heat dissipation pad 117 exposed to the outside compared to the semiconductor package of FIG. 5A.

As illustrated in (c) of FIG. 5, the semiconductor package 100-4 may be mounted on a printed circuit board 10 through the connection pad 116 and the heat dissipation pad 117. In this case, the connection pad 116 and the heat dissipation pad 117 may be mounted on a pad 12 on a printed circuit board 10 through a solder 11.

Accordingly, the semiconductor package of (c) in FIG. 5 may improve heat dissipation characteristics by dissipating heat generated by the semiconductor chip 124 to the outside through the printed circuit board 10.

Figure 6:
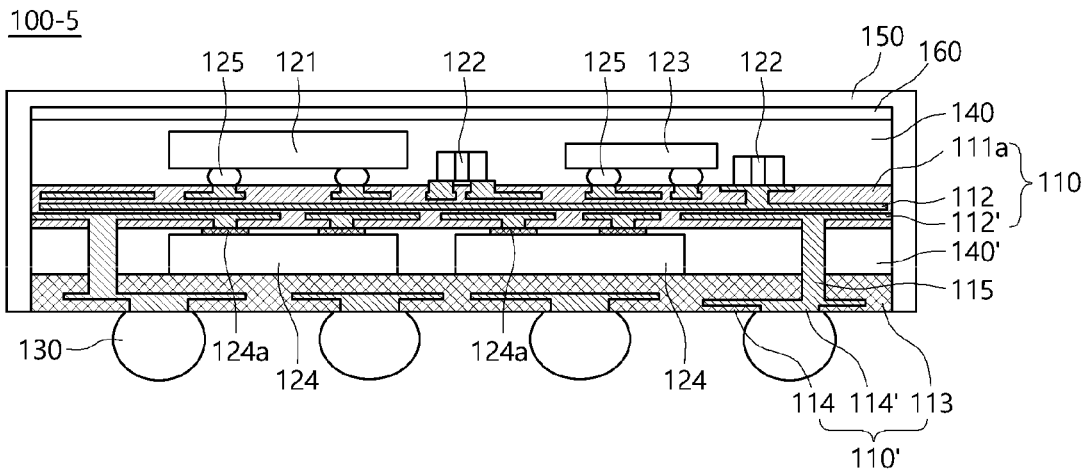
FIG. 6 is a cross-sectional view of a semiconductor package according to a fifth modification example of the present invention.
Figure 7:
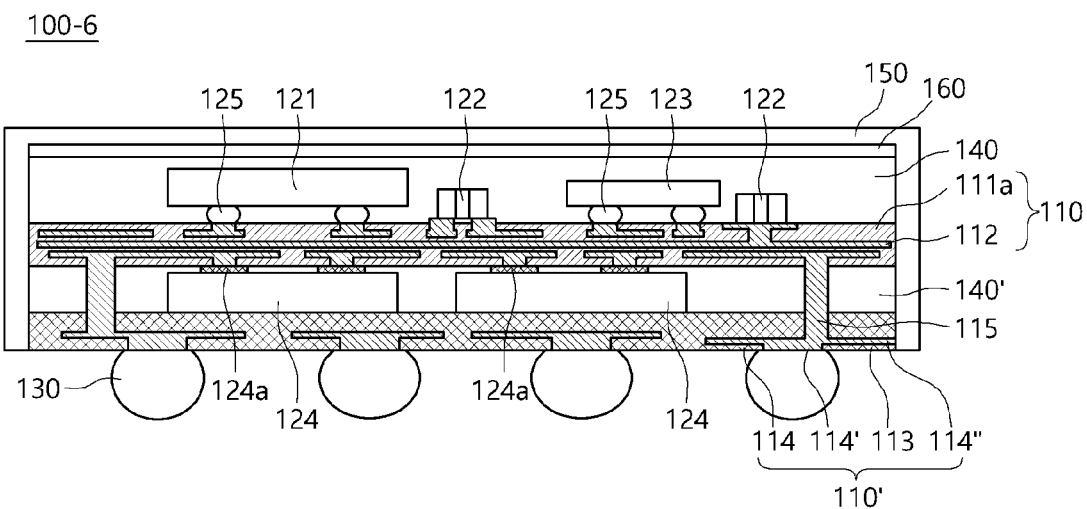
FIG. 7 is a cross-sectional view of a semiconductor package according to a sixth modification example of the present invention.
Figure 8:
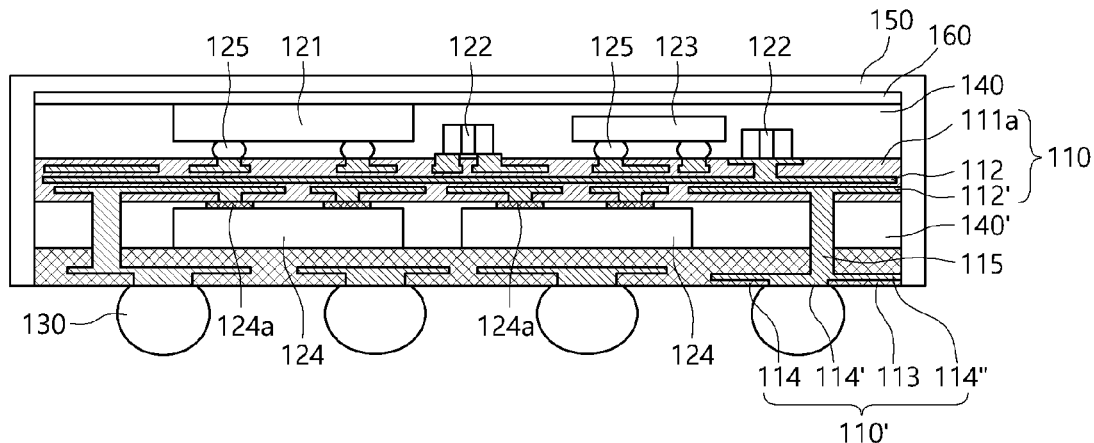
FIG. 8 is a cross-sectional view of a semiconductor package according to a seventh modification example of the present invention.

FIG. 6 is a cross-sectional view of a semiconductor package according to a fifth modification example of the present invention, FIG. 7 is a cross-sectional view of a semiconductor package according to a sixth modification example of the present invention, and FIG. 8 is a cross-sectional view of a semiconductor package according to a seventh modification example of the present invention.

Compared to the semiconductor package 100-1 of the first modification example, the semiconductor packages 100-5 to 100-7 according to the fifth to seventh modification examples have a structure in which a part of at least one wiring pattern among the redistributed layers 110 and 110' is extended and formed to a shield layer 150. Since the constitutions other than the above are the same as those of the semiconductor package 100-1 of the first modification example, the detailed description thereof will be omitted.

Herein, the semiconductor packages 100-5 to 100-7 according to the fifth to seventh modification examples are illustrated and described as being based on the semiconductor package 100-1 of the first modification example, but are not limited thereto, and it may be certainly applied to the semiconductor packages according to the first example and other modification examples.

More specifically, referring to FIG. 6, in the semiconductor package 100-5 according to the fifth modification example, the shield layer 150 may be grounded with a sidewall ground line 112' of the first redistributed layer 110. That is, the wiring pattern 112 of the first redistributed layer 110 may include a ground line 112' which is formed to extend to be connected to the shield layer 150. In this case, the wiring pattern 112 of the second redistributed layer 110' is not extended to the shield layer 150. That is, the shield layer 150 may not be grounded with the sidewall ground line of the second redistributed layer 110'.

Referring to FIG. 7, in the semiconductor package 100-6 according to the sixth modification example, the shield layer 150 may be grounded with the sidewall ground line 114" of the second redistributed layer 110'. That is, the wiring pattern 114 of the second redistributed layer 110' may include a ground line 114" which is formed to extend to be connected to the shield layer 150. In this case, the wiring pattern of the first redistributed layer 110 is not extended to the shield layer 150. That is, the shield layer 150 may not be grounded with the sidewall ground line of the first redistributed layer 110.

Referring to FIG. 8, in the semiconductor package 100-7 according to the seventh modification example, the shield layer 150 may be grounded with the sidewall ground line 112' of the first redistributed layer 110 and the side wall ground line 114" of the second redistributed layer 110'. That is, the shield layer 150 may be grounded with both of the sidewall ground lines 112' and 114" of the first redistributed layer 110 and the second redistributed layer 110'.

Figure 9:
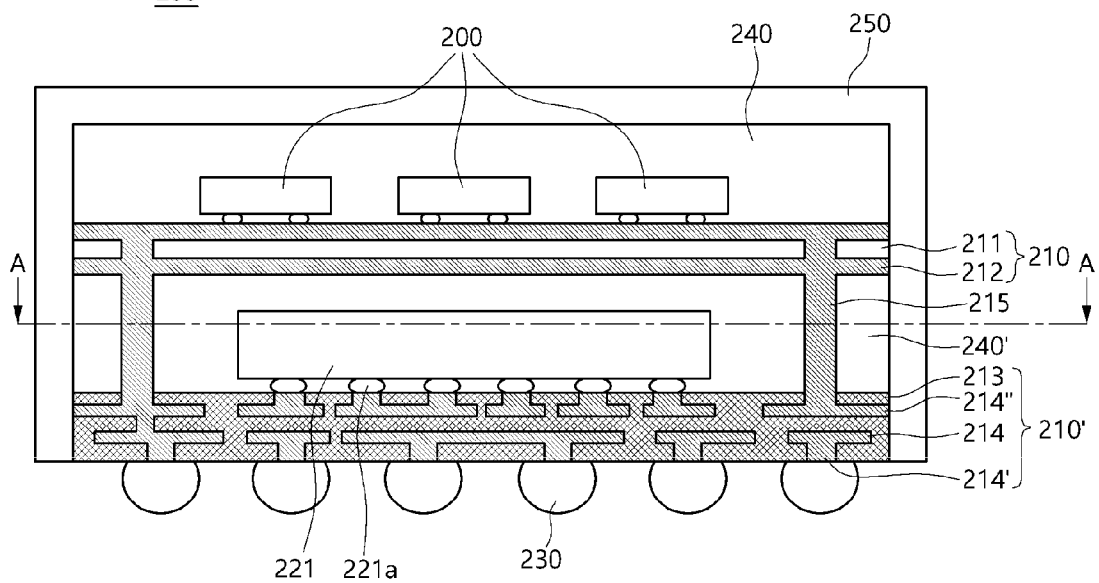
FIG. 9 is a cross-sectional view of a semiconductor package according to a second example of the present invention.

FIG. 9 is a cross-sectional view of a semiconductor package according to a second example of the present invention.

The semiconductor package 200 according to the second example includes redistributed layers 210 and 210', a metal plate 212, a digital block 221, an analog block 222, an external connection terminal 230, molds 240 and 240', and a shield layer 250.

Herein, the semiconductor package 200 is the same as the semiconductor package 100-3 according to the third modification example, except that the analog block 222 is provided on the first redistributed layer 210. That is, since the redistributed layers 210 and 210', the 3D via 215, the external connection terminal 230, the molds 240 and 240, and the shield layer 250 are identical or similar to the redistributed layers 110 and 110', the 3D via 115, the external connection terminal 130, the molds 140 and 140, and the shield layer 150 of FIG. 4, the detailed description thereof will be omitted.

The digital block 221 may be a semiconductor chip. For example, the digital block 221 may be a digital semiconductor chip. The semiconductor chip may be mounted on the second redistributed layer 210' through a solder 221a.

The analog block 222 may include a passive device and an analog semiconductor chip. Herein, the passive device is a device for operating or assisting the function of the semiconductor chip, and may include a resistor, a capacitor, and a coil. In addition, the passive device may be any one of an IPD, a balun, a filter, a coupler, and a diplexer, but is not limited thereto. The analog semiconductor chip and the passive device may be mounted on the first redistributed layer 210 through a solder.

Accordingly, in the semiconductor package 200, each of the digital block 221 and the analog block 222 is formed on the same surface (e.g., the upper surface) with respect to the first redistributed layer 210 and the second redistributed layers 210', and thus, the manufacturing may be easy.

In the second redistributed layer 210', a part of the wiring pattern 214 may be formed to extend to a shield layer 250. That is, the shield layer 250 may be grounded with a sidewall ground line 214" of the second redistributed layer 210'.

Further, in order to increase the shielding effect of the present invention, a metal plate 212 is added in addition to the shield layer 150. The metal plate 212 primarily shields the digital block 221 and secondarily shields the shield layer 150, thereby increasing the shielding effect by using a plurality of shield layers.

Moreover, the 3D via 215 may be provided to surround the digital block 221 on a plane. That is, the 3D via 215 may be provided along the outside of the digital block 221. The 3D via 215 may be tightened through wire bonding, Cu Post, or laser hole processing.

Figure 10:
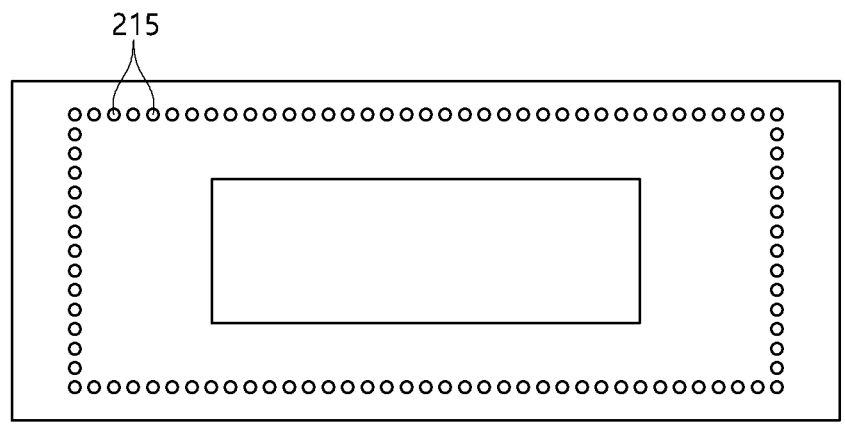
FIG. 10 is a plan view for confirming a difference in the shape of a 3D via on line A of FIG. 9.
Figure 10:
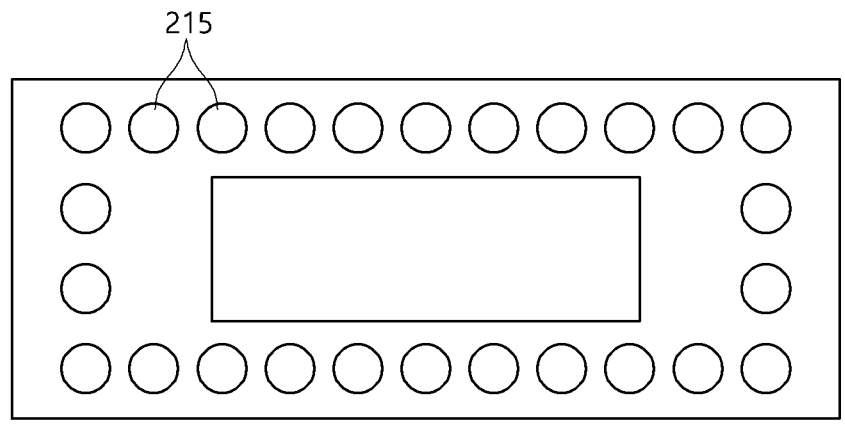
Figure 10:
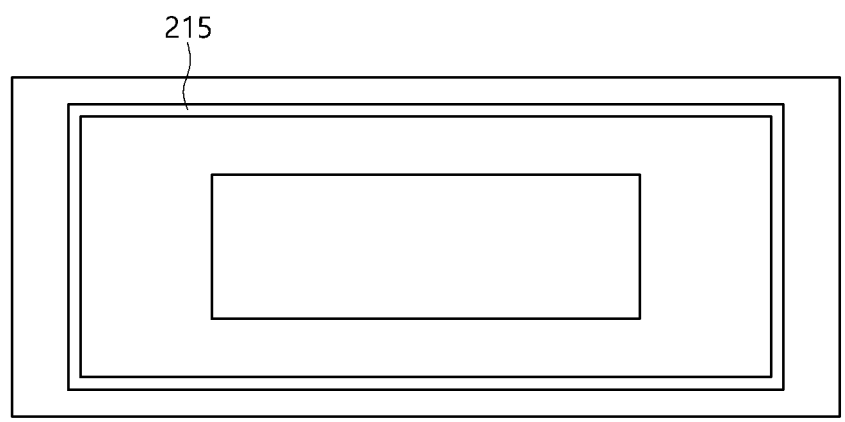

FIG. 10 is a plan view for confirming a difference in the shape of a 3D via on line A of FIG. 9.

(A) of FIG. 10 shows a 3D via 215 formed by wire bonding, (b) a post, and (c) a laser hole processing.

The 3D vias formed by using wire bonding and a post are separated from each other and are arranged in a dotted line structure on a densely arranged plane, and the 3D via formed by laser hole processing is an integral linear structure on the plane where there is no gap occurring therebetween.

The 3D via 215 is formed around the digital block 221 to shield the digital block 221, and when it is formed by using wire bonding and a post, it is possible to increase the shielding effect by forming to be as dense as possible.

The 3D via 215 formed by laser hole processing is a wall structure without gaps, and thus, the shielding effect may be further increased.

Figure 11:
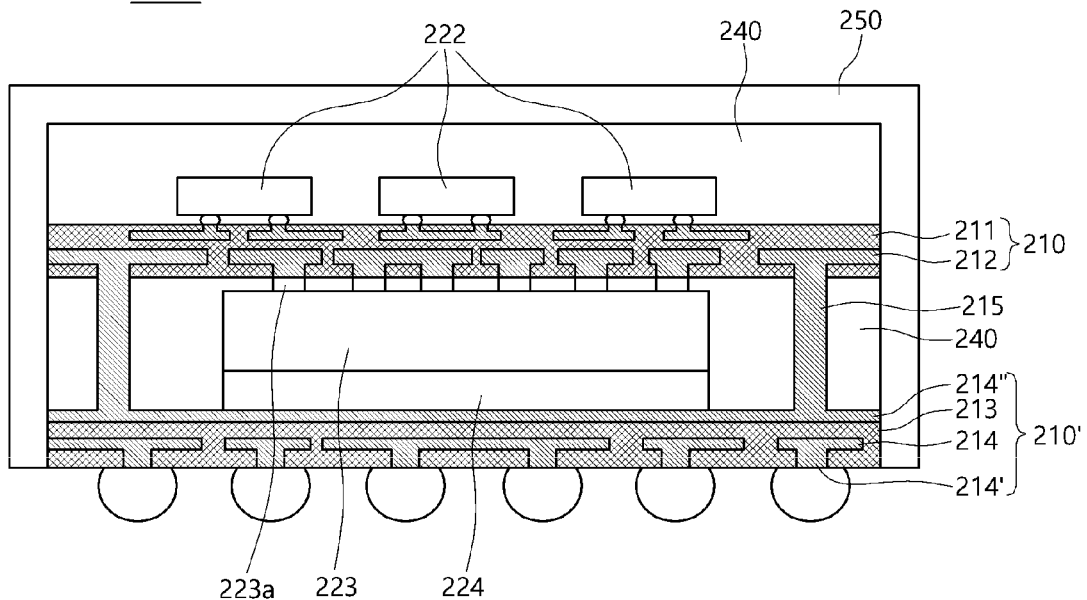
FIG. 11 is a cross-sectional view of a semiconductor package according to an eighth modification example of the present invention.

FIG. 11 is a cross-sectional view of a semiconductor package according to an eighth modification example of the present invention.

In the semiconductor package 200-1 according to the eighth modification example, compared to the semiconductor package 200 according to the second example, the digital block 223 is mounted on the first redistributed layer 210, and the digital block 223 is supported by tape 224. Since the constitutions other than the above are the same as those of the semiconductor package 200 according to the second example, the detailed description thereof will be omitted.

The digital block 223 may be arranged such that the first surface on which a pad 223a is provided faces the first redistributed layer 210, and the second surface opposite to the pad 223a faces the second redistributed layer 210'. That is, the digital block 223 may be connected to the first redistributed layer 210.

Accordingly, since the wiring of the digital block 223 becomes shortened in the semiconductor package 200-1, high-speed processing may be stably performed.

In addition, heat dissipation easily occurs to the rear surface of the digital block 223 by the tape 224, and thus, heat dissipation characteristics are improved.

The tape 224 may be provided between the digital block 223 and the second redistributed layer 210'. The tape 224 may support the lower surface of the digital block 223.

The tape 224 may be made of an insulating material, and an adhesive layer may be provided on a surface to which the digital block 223 comes into contact.

In addition, by providing a structure in which the metal plate 212 is in contact with the shield layer 250, the shield layer 250 is configured to perform a shielding function as well as a ground role.

Accordingly, since the semiconductor package 200-1 has an effect of increasing the ground, noise may be reduced, and a shielding rate may be improved.

Figure 12:
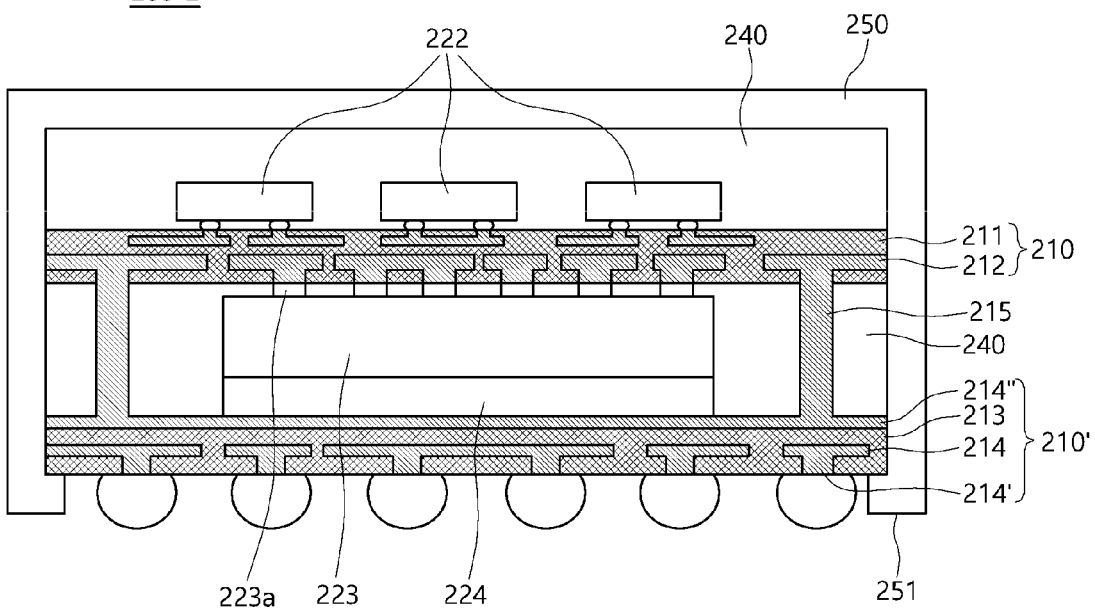
FIG. 12 is a cross-sectional view of a semiconductor package according to a ninth modification example of the present invention.
Figure 13:
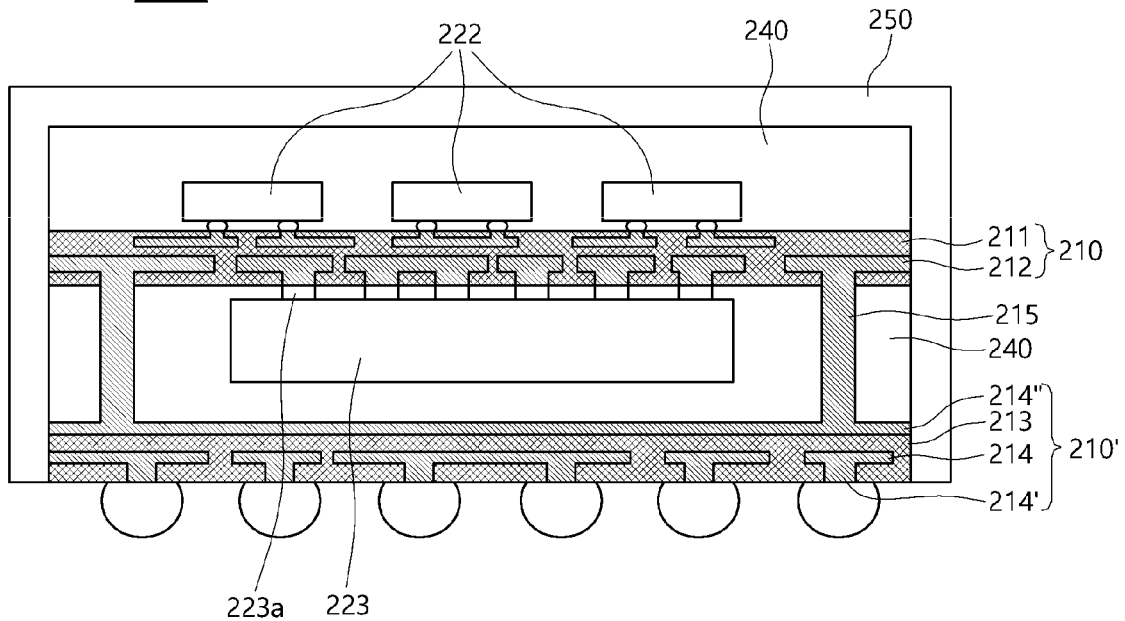
FIG. 13 is a cross-sectional view of a semiconductor package according to a tenth modification example of the present invention.

FIG. 12 is a cross-sectional view of a semiconductor package according to a ninth modification example of the present invention, and FIG. 13 is a cross-sectional view of a semiconductor package according to a tenth modification example of the present invention.

In the semiconductor packages 200-2 and 200-3 according to the ninth and tenth modification examples, compared to the semiconductor package 200-1 according to the eighth modification example, the shield layer 250' is formed to extend to the lower surface, or it has a structure in which the tape is omitted. Since the constitutions other than the above are the same as those of the semiconductor package 200-1 according to the eighth modification example, the detailed description thereof will be omitted.

Referring to FIG. 12, in the semiconductor package 200-2 according to the ninth modification example, the shield layer 250' may be formed to extend to the vicinity of the external connection terminal 230. That is, the lower end 251 of the shield layer 250' may be provided to further extend from the second redistributed layer 210' toward the external connection terminal 230.

Accordingly, when the semiconductor package 200-2 is attached to a printed circuit board, alignment may be advantageous, and a height difference between the printed circuit board and the semiconductor package may be adjusted by the shield layer 250'.

Referring to FIG. 13, in the semiconductor package 200-3 according to the tenth modification example, tape supporting the digital block 223 may be omitted. Herein, the digital block 223 may be spaced apart from the second redistributed layer 210'. That is, the digital block 223 may be surrounded by the second mold 240'.

Accordingly, the semiconductor package 200-3 may be safely protected from external impact by configuring only with the second mold 240' between the redistributed layers 210 and 210', thereby improving product reliability.

Figure 14:
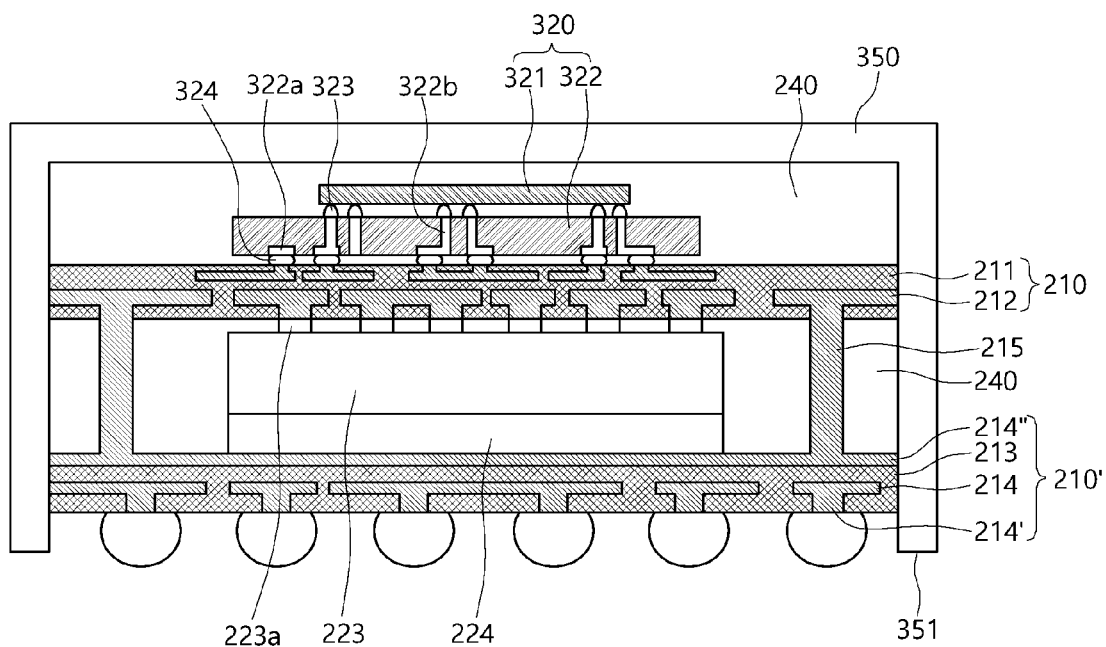
FIG. 14 is a cross-sectional view of a semiconductor package according to a third example of the present invention.

FIG. 14 is a cross-sectional view of a semiconductor package according to a third example of the present invention.

The semiconductor package 300 according to the third example includes redistributed layers 310 and 310', a digital block 221, a commercial chip 320, an external connection terminal 230, molds 240 and 240', and a shield can 350.

Herein, the semiconductor package 300 is the same as the semiconductor package 200-1 according to the ninth modification example, except that the commercial chip 320 is provided on the first redistributed layer 210. That is, since the redistributed layers 210 and 210', the 3D vias 215, the external connection terminal 230, and the molds 240 and 240 are identical or similar to those of FIG. 10, the detailed description thereof will be omitted.

As an analog block, the commercial chip 320 may be a separately manufactured semiconductor chip. Herein, in the commercial chip 320, the analog block of FIG. 10 may be configured in a single package. For example, the commercial chip 320 may include a first semiconductor chip 321 and a second semiconductor chip 322 as a semiconductor package.

In this case, the first semiconductor chip 321 may be stacked on the second semiconductor chip 322 through a solder 323. Herein, the second semiconductor chip 322 provided at the lower side may be provided with a via 322b. The pad 322a of the second semiconductor chip may be mounted on the first redistributed layer 210 through a solder 324.

Accordingly, the semiconductor package 300 may freely mount and use various commercial chips 320 that are independently manufactured in advance.

The shield can 350 may be a separately manufactured can type. In this case, the shield can 350 may be formed to extend to the vicinity of the external connection terminal 230. That is, the lower end 351 of the shield can 350 may be provided to further extend from the second redistributed layer 210' toward the external connection terminal 230.

Accordingly, the semiconductor package 300 may easily manufacture a shielding structure when an EMI shielding function is added.

Figure 15:
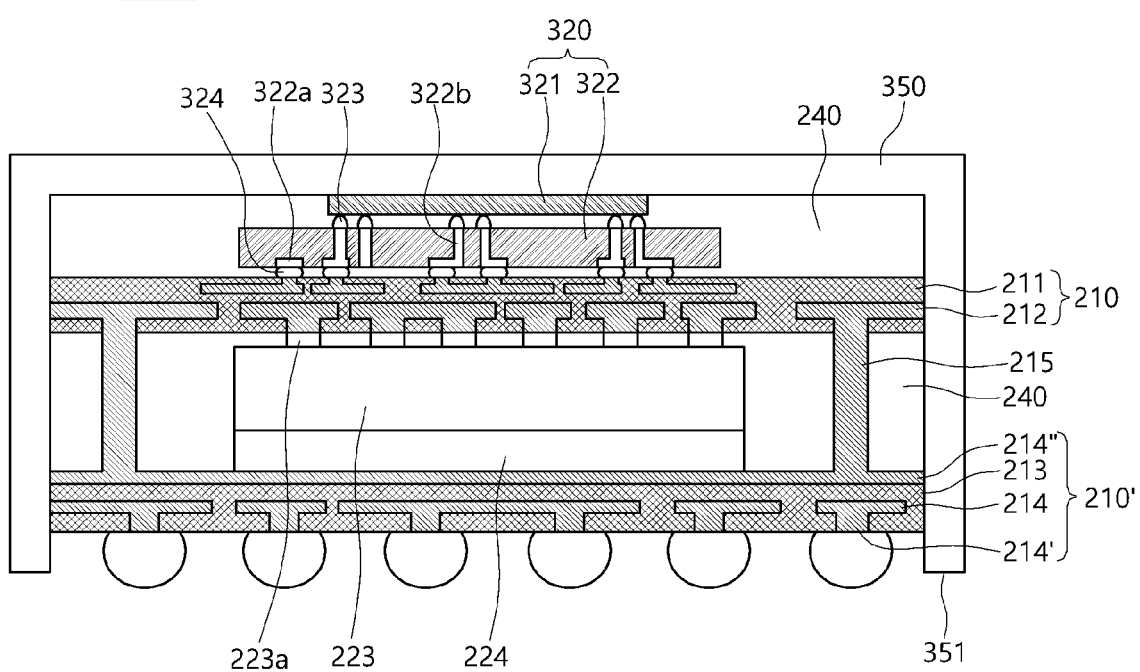
FIG. 15 is a cross-sectional view of a semiconductor package according to an eleventh modification example of the present invention.

FIG. 15 is a cross-sectional view of a semiconductor package according to an eleventh modification example of the present invention.

In the semiconductor package 300-1 according to the eleventh modification example, compared to the semiconductor package 300 according to the third example, the commercial chip 320 is in contact with the shield can 350. Since the constitutions other than the above are the same as those of the semiconductor package 300 according to the third example, the detailed description thereof will be omitted.

The shield can 350 may be provided to contact the upper surface of the commercial chip 320. That is, the first mold 340 may be provided to cover a side surface of the commercial chip 320 except the upper surface thereof. Accordingly, the first mold 340 may be provided to be thinner than that of the semiconductor package 300 of the third example.

Accordingly, in the semiconductor package 300-1, heat generated from the commercial chip 320 may be radiated to the outside through the shield can 350. That is, the shield can 350 may function as a heat sink of the commercial chip 320.

Figure 16:
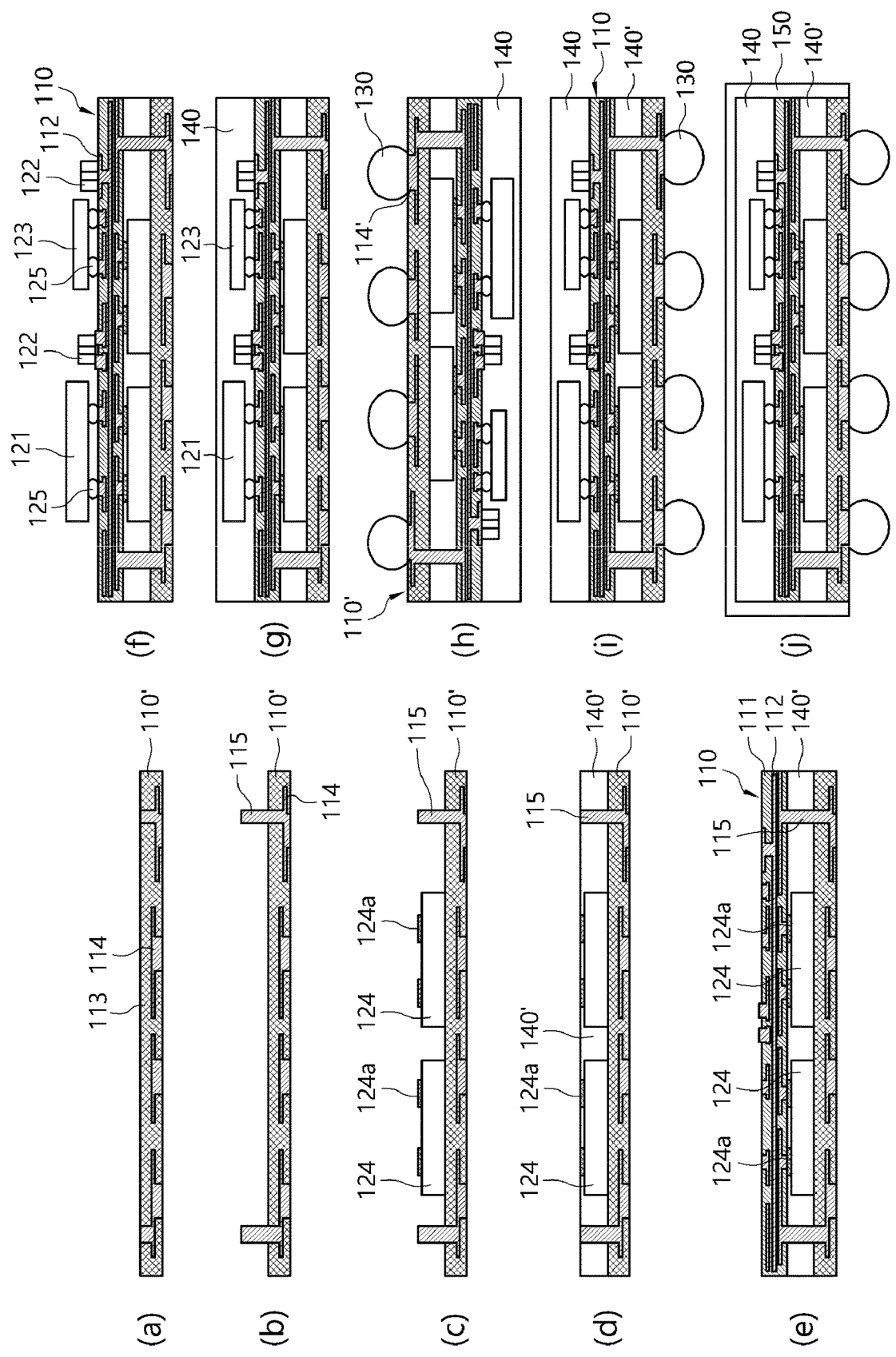
FIG. 16 is a view for describing the manufacturing process of a semiconductor package according to the first example of the present invention.

FIG. 16 is a view for describing the manufacturing process of a semiconductor package according to the first example of the present invention. Herein, the description of the manufacturing process may be described based on the semiconductor package 100-3 of the third modification example.

The manufacturing process of the semiconductor package according to the first example of the present invention may be performed in the manner of combining a chip-first/face-up and chip-last/face-down of FOWLP.

First, a second redistributed layer 110' is formed (refer to (a) of FIG. 16). In this case, the second redistributed layer 110' may be formed on a carrier substrate (not illustrated). In addition, the second redistributed layer 110' may include an insulating layer 113 and a wiring pattern 114.

The 3D via 115 is formed on the second redistributed layer 110' (refer to (b) of FIG. 16). In this case, the 3D via 115 may be formed to extend from a part of the wiring pattern 114 of the second redistributed layer 110'.

The semiconductor chip 124 is bonded to one surface of the second redistributed layer 110' (refer to (c) of FIG. 16). In this case, the semiconductor chip 124 may be bonded to the upper surface of the second redistributed layer 110' through an adhesive layer.

The second mold 140' is formed on the upper surface of the second redistributed layer 110' (refer to (d) of FIG. 16).

In this case, the second mold 140' may be formed to expose one surface of the 3D via 115 and the chip pad 124a of the semiconductor chip 124.

The first redistributed layer 110 is formed on the second mold 140' (refer to (e) of FIG. 16). The first redistributed layer 110 may be formed such that the semiconductor chip 124 and the 3D via 115 are connected to the wiring pattern 112. In this case, the first redistributed layer 110 may be configured by three layers of an insulating layer 111 and a wiring pattern 112. In addition, a part of the wiring pattern 112 may be formed to be exposed.

The semiconductor chips 121 and 123 and the passive device 122 are mounted on the first redistributed layer 110 by the SMT process (refer to (f) of FIG. 16). The semiconductor chips 121 and 123 and the passive device 122 may be mounted on the wiring pattern 112 exposed through the solder 125.

The first mold 140 is formed on the upper side of the wiring pattern 112 to cover the semiconductor chips 121 and 123 and the passive device 122 (refer to (g) of FIG. 16). In this case, the first mold 140 may be formed by the vacuum printing encapsulation system (VPES).

After the connection pad area 114' is formed while the second redistributed layer 110' is rotated, the external connection terminal 130 is formed on the connection pad area 114' (refer to (h) of FIG. 15). Herein, the external connection terminal 130 may have an SAC-series solder bump in a ball shape. In this case, the carrier substrate (not illustrated) of the second redistributed layer 110' is removed. Further, the connection pad area 114' may be formed on one surface (the upper surface in the drawing) of the second redistributed layer 110' by vapor deposition or sputtering.

Optionally, after the solder bump is formed, a non-photosensitive insulating layer may be deposited and then subjected to grinding. Accordingly, the reliability of the product may be improved by preventing the first redistributed layer 110 from protruding to the outside.

The second redistributed layer 110' is rotated again (refer to (i) of FIG. 16).

In this state, the shield layer 150 is formed along the outer surface of the first mold 140 (refer to (j) of FIG. 15). In this case, the shield layer 150 may be formed by a sputter process using metal sheets. As another example, the shield layer 150 may be formed by the SMT process using a metal can.

Meanwhile, in the case of manufacturing the semiconductor package according to the fourth modification example using such a process, since the second redistributed layer 110' is omitted, after the build-up process (refer to (b) to (d) of FIG. 16) proceeds by utilizing a different carrier substrate instead of the second redistributed layer 110', the connection pad 116 and the heat dissipation pad 117 may be formed at the end.

As another example, the carrier substrate may be removed after the connection pad 116 and the heat dissipation pad 117 are first formed on the carrier substrate, and the build-up process (refer to (b) to (d) of FIG. 16) is completed.

Figure 17:
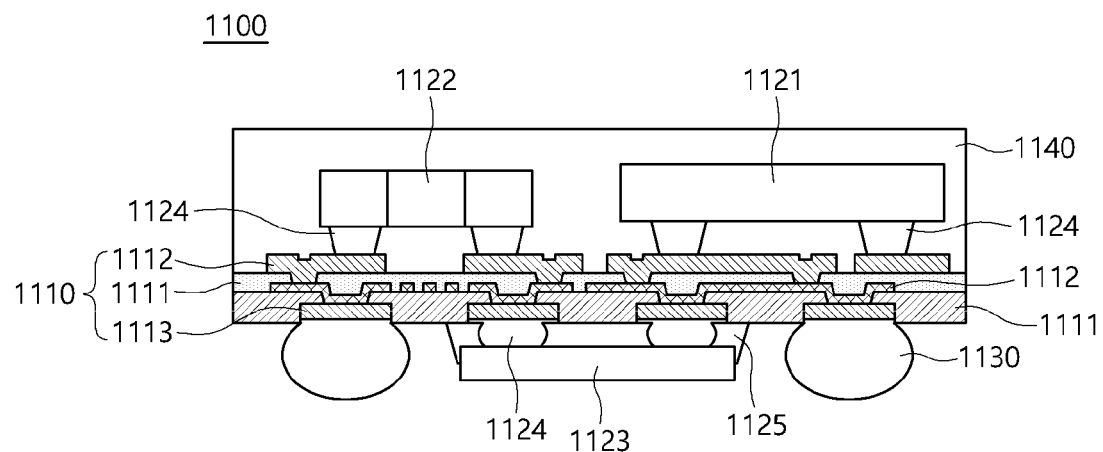
FIG. 17 is a cross-sectional view of a semiconductor package having a single redistributed layer according to an exemplary embodiment of the present invention.

FIG. 17 is a cross-sectional view of a semiconductor package according to another exemplary embodiment of the present invention. FIG. 17 is an example of a single redistributed layer 1110 structure.

The semiconductor package 1100 according to an exemplary embodiment of the present invention includes a redistributed layer 1110, semiconductor chips 1121 and 1123, a passive device 1122, an external connection terminal 1130, and a mold 1140.

Herein, as SiP, the semiconductor package 1100 has a redistributed structure in which semiconductor chips may be mounted on upper and lower surfaces, and has a multichip structure including heterogeneous semiconductor chips. That is, the semiconductor package 1100 may include a plurality of semiconductor chips 1121 and 1123. Moreover, the semiconductor package 1100 may include a plurality of passive devices 1122.

The redistributed layer 1110 is applied with a thin profile and a fine pitch structure. The redistributed layer 1110 may have a semiconductor chip 1121 and a passive device 1122 mounted on one surface thereof. Herein, the redistributed layer 1110 may include an insulating layer 1111, a wiring pattern 1112, and a UBM layer 1113. In addition, the redistributed layer 1110 may be a redistributed substrate. In this case, the redistributed substrate may be a thin-film profile and a fine pitch substrate.

Moreover, semiconductor chips 1121 and 1123 may be mounted on both surfaces of the redistributed layer 1110. In this case, the semiconductor chip 1121 may be provided above the redistributed layer 1110, and the semiconductor chip 1123 may be provided below the redistributed layer 1110. That is, the semiconductor chip 1123 may be provided outside the mold 1140.

The insulating layer 1111 may be made of a material having a low dielectric constant (Dk) and dissipation factor (Df). Herein, it is preferable that the dielectric constant (Dk) is 2 to 3, and the dissipation factor (Df) is 0.002 to 0.005. Accordingly, the semiconductor package 1100 may be utilized for high-speed RF signal transmission.

In this case, the insulating layer 1111 may be formed of an insulating polymer, epoxy, a silicon oxide film, a silicon nitride film (SiN), or a combination thereof. In addition, the insulating layer 1111 may be made of a non-photosensitive material or a photosensitive material. For example, the insulating layer 1111 may be made of polyimide (PI).

Herein, the insulating polymer may include a general-purpose polymer such as polymethylmethacrylate (PMMA), polystyrene (PS), polybenzoxazoles (PBO), and the like, an acrylic polymer, an imide polymer (polyimide (PI)), an aryl ether polymer, an amide polymer, a fluorine polymer, a p-xylene polymer, a vinyl alcohol polymer, a polymer derivative having a phenol group, or a combination thereof.

A plurality of insulating layers 1111 may be provided on each upper side of the wiring pattern 1112. However, the insulating layer 1111 may be provided such that the wiring pattern 1112 disposed on the upper side is exposed.

Accordingly, the passive device 1122 and the semiconductor chip 1121 may be directly mounted on the exposed wiring pattern 1112. In this case, the passive device 1122 and the semiconductor chip 1121 may be mounted on the wiring pattern 1112 through soldering.

As the uppermost insulating layer is excluded from the redistributed layer 1110 as described above, the semiconductor package 1100 may reduce the manufacturing cost and simplify the process.

The wiring pattern 1112 may be a pattern for electrically connecting the upper and lower surfaces of the redistributed layer 1110. To this end, the wiring pattern 1112 may be made of a conductive material. Herein, the wiring pattern 1112 may be formed of W, Cu, Zr, Ti, Ta, Al, Ru, Pd, Pt, Co, Ni, or a combination thereof. For example, the wiring pattern 1112 may be made of Cu. Herein, the L/S (Line & Space) of the wiring pattern 1112 may be 10/10 µm or less.

In this case, the redistributed layer 1110 may configured by 2 layers of a wiring pattern 1112. As a result, the overall thickness of the semiconductor package 1100 is reduced, thereby achieving miniaturization. Herein, in the wiring pattern 1112, a UBM layer may be provided at positions corresponding to the semiconductor chip 1121 and the passive device 1122. The UBM layer is for connecting the semiconductor chip 1121 and the passive device 1122.

Herein, the thickness of the insulating layer 1111 and the wiring pattern 1112 constituting the first layer may be 0.1 µm to 30 µm. Preferably, it may be 1 µm to 15 µm. The thickness of other wiring patterns excluding the first layer may be 0.1 µm to 30 µm, and preferably, 1 µm to 15 µm.

The UBM layer described above may be omitted in the first layer, and the wiring pattern 1112 of the first layer may be formed to be thicker than that of the other layers such that it may perform the role of the UBM layer together.

Moreover, the thicknesses of each layer of the wiring patterns 1112 may be different from each other. For example, the thickness of the wiring pattern 1112 on the side where the passive device 1122 and the semiconductor chip 1121 are mounted may be thicker than the thickness of the wiring pattern 1112 provided below. In addition, the wiring pattern 1112 on the side where the external connection terminal 1130 is provided may be provided to be relatively thick.

That is, the wiring pattern of the first layer, which is the lowermost layer of the wiring pattern 1112, and the wiring pattern of the uppermost layer may be formed to be thicker than other wiring patterns between the lowermost layer and the uppermost layer.

The UBM layer 1113 may be formed to be exposed from the lower surface of the redistributed layer 1110. The UBM layer 1113 is for connecting the external connection terminal 1130 to the redistributed layer 1110. The UBM layer 1113 may be formed by vapor deposition or sputtering. In this case, the UBM layer 1113 may be formed of Cr/Cr-Cu/Cu, Ti-W/Cu, or Al/Ni-v/Cu.

Meanwhile, the redistributed layer 1110 may be formed of a plurality of layers. That is, the redistributed layer 1110 may be formed of a plurality of layers of the insulating layer 1111 and the wiring pattern 1112 depending on the type and quantity of the semiconductor chips 1121 and 1123.

The semiconductor chips 1121 and 1123 may include a digital chip or an analog chip. Further, the semiconductor chips 1121 and 1123 may include a logic chip or a memory chip such as system large-scale integration (LSI). Herein, the semiconductor chip 1121 may be an analog semiconductor chip, and the semiconductor chip 1123 may be a digital semiconductor chip. However, the present invention is not limited thereto, and the semiconductor chip 1121 may be a digital semiconductor chip, and the semiconductor chip 1123 may be an analog semiconductor chip.

The semiconductor chip 1123 may be provided in an area under the redistributed layer 1110 where the external connection terminal 1130 is not formed. In this case, an underfill layer 1125 may be provided between the semiconductor chip 1123 and the redistributed layer 1110. The underfill layer 1125 may be provided to surround the solder 1124 under the semiconductor chip 1123.

The passive device 1122 may be a device for operating or assisting the function of the semiconductor chips 1121 and 1123. The passive device 1122 may include a resistor, a capacitor, and a coil. In addition, the passive device 1122 may be an integrated passive device (IPD). Herein, the passive device 1122 may be any one of a balun, a filter, a coupler, and a diplexer, but is not limited thereto.

In this case, the interval between the semiconductor chip 1121 and the passive device 1122 may be 10 µm to 200 µm. Preferably, the interval between the semiconductor chip 1121 and the passive device 1122 may be 75 µm to 150 µm.

The semiconductor chip 1121 and the passive device 1122 may be mounted on the redistributed layer 1110 through a solder 1124.

The external connection terminal 1130 may be a terminal for signal input or signal output of the semiconductor package 1100. That is, the external connection terminal 1130 may be a connection terminal for mounting the semiconductor package 1100 on a board such as a printed circuit board and the like.

The external connection terminal 1130 may be formed on the lower surface of the UBM layer 1113. Accordingly, the external connection terminal 1130 may be electrically connected to the semiconductor chips 1121 and 1123 or the passive device 1122 through the UBM layer 1113 and the wiring pattern 1112.

The external connection terminal 1130 may include a solder bump. Herein, the external connection terminal 1130 may include Sn, Au, Ag, Ni, In, Bi, Sb, Cu, Zn, Pb, or a combination thereof, but is not limited thereto. For example, the solder may be made of the Sn—Ag—Cu (SAC) series. In this case, the solder bump may have a ball shape.

The mold 1140 may be provided on the redistributed layer 1110 to cover the plurality of semiconductor chips 1121 and 1123 and the plurality of passive devices 1122. Herein, the mold 1140 may be made of epoxy resin. In this case, the mold 1140 may be formed by the vacuum printing encapsulation system (VPES).

Figure 18:
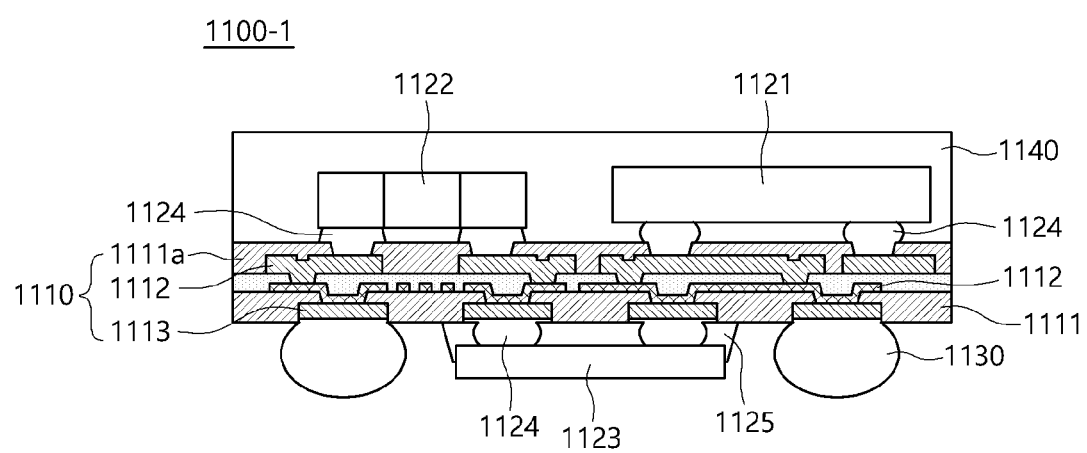
FIG. 18 is a cross-sectional view of a semiconductor package having a single redistributed layer according to the first modification example of the present invention.

FIG. 18 is a cross-sectional view of a semiconductor package having a single redistributed layer according to the first modification example of the present invention.

Compared to the semiconductor package 1100 of FIG. 17, the semiconductor package 1100-1 according to the first modification example is provided such that the wiring pattern 1112 is not exposed to the outside except a part thereof, and it has a structure in which a semiconductor chip 1121 and a passive device 1122 are mounted on the partially exposed wiring pattern 1112. Since the constitutions other than the above are the same as those of the semiconductor package 1100 of FIG. 17, the detailed description thereof will be omitted.

In this case, the semiconductor package 1100-1 may be provided such that an additional insulating layer 111a covers the wiring pattern 1112 provided on the upper side. Herein, the semiconductor chip 1121 and the passive device 1122 may be mounted on the wiring pattern 1112 from which the insulating layer 1111a is removed. That is, the insulating layer 1111a may be provided to cover the wiring pattern 1112 provided on the upper side except for positions corresponding to the semiconductor chip 1121 and the passive device 1122.

As such, the redistributed layer 1110 may be an embedded trace substrate (ETS). Accordingly, the wiring pattern 1112 on the upper side on which the passive device 1122 and the semiconductor chip 1121 are mounted is not exposed to the outside, and there is no part in contact with the air surface, thereby minimizing external resistance, and thus, the redistributed layer 1100 may implement the function of fast signal and RF trace.

Figure 19:
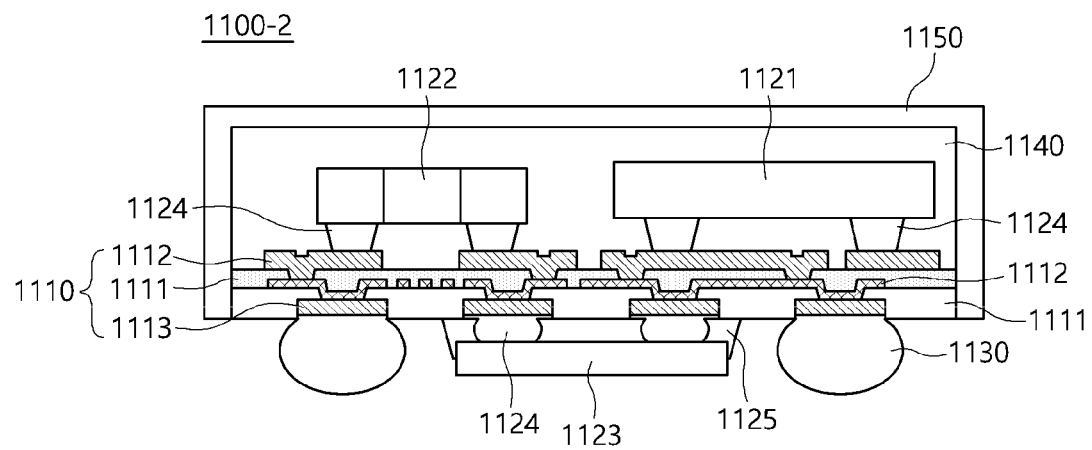
FIG. 19 is a cross-sectional view of a semiconductor package having a single redistributed layer according to the second modification example of the present invention.

FIG. 19 is a cross-sectional view of a semiconductor package having a single redistributed layer according to the second modification example of the present invention.

Compared to the semiconductor package 1100 of FIG. 17, the semiconductor package 1100-2 according to the second modification example has a structure in which the shield layer 1150 is provided along the outer surface of the mold 1140. Since the constitutions other than the above are the same as those of the semiconductor package 1100 of FIG. 1, the detailed description thereof will be omitted.

Herein, the semiconductor package 1100-2 according to the second modification example is illustrated and described as being based on the semiconductor package 1100 of FIG. 17, but is not limited thereto, and it may be applied to semiconductor packages according to other modification examples.

More specifically, the shield layer 1150 may be provided to extend to the side surface of the redistributed layer 1110. The shield layer 1150 may have an electromagnetic interference (EMI) shielding function.

For example, the shield layer 1150 may be made of a metal material capable of shielding electromagnetic waves. As another example, the shield layer 1150 may be made of a material capable of absorbing a specific electromagnetic wave. For example, the shield layer 1150 may be made of ferrite.

In this case, the shield layer 1150 may be formed by a sputter process using a metal seed. Optionally, the shield layer 1150 may be formed by the SMT process using a metal can. In addition, the shield layer 1150 may be omitted by configuring the mold 1140 of an electromagnetic wave absorbing material such as ferrite.

Figure 20:
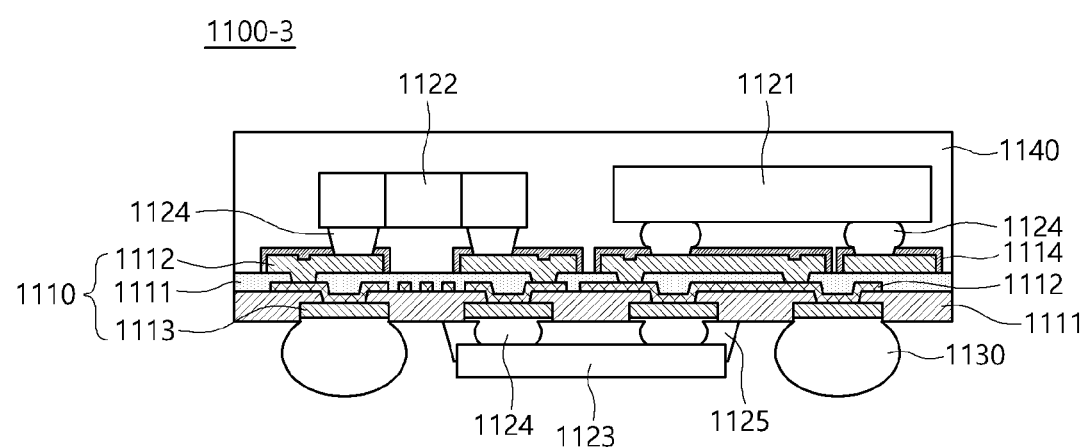
FIG. 20 is a cross-sectional view of a semiconductor package having a single redistributed layer according to the third modification example of the present invention.

FIG. 20 is a cross-sectional view of a semiconductor package having a single redistributed layer according to the third modification example of the present invention.

Compared to the semiconductor package 1100 of FIG. 17, the semiconductor package 1100-3 according to the third modification example has a structure in which the semiconductor chip 1121 and the passive device 1122 are mounted on the wiring pattern 1112, after performing black oxidation on the wiring pattern 1112 exposed to the outside. Since the constitutions other than the above are the same as those of the semiconductor package 1100 of FIG. 17, the detailed description thereof will be omitted.

Herein, the semiconductor package 1100-3 according to the third modification example is illustrated and described as being based on the semiconductor package 1100 of FIG. 17, but is not limited thereto, and it may be certainly applied to semiconductor packages according to other modification examples.

More specifically, the redistributed layer 1110 may include the insulating layer 1111, the wiring pattern 1112, and the UBM layer 1113, but it may be exposed to the upper side of the insulating layer 1111 of the wiring pattern 1112.

In this case, the semiconductor package 100-3 according to the third modification example may be provided with an oxide layer 1114 on the exposed wiring pattern 1112. Herein, the oxide layer 1114 may be formed by black oxidation. The oxide layer 1114 generated by black oxidation may include copper oxide such as $CuO$, $Cu_2O$ and the like, when the wiring pattern 1112 is formed of Cu. As such, the oxide layer 1114 may be removed from a portion where the passive device 1122 and the semiconductor chip 1121 are connected through the solder 1124.

That is, the semiconductor package 1100-3 may have a structure in which the oxide layer 1114 is formed on the exposed wiring pattern 1112 by black oxidation in place of the insulating layer 1111 provided on the uppermost portion included in the redistributed layer 1110.

Accordingly, the passive device 1122 or the semiconductor chip 1121 may be directly mounted on the exposed wiring pattern 1112. In this case, the passive device 1122 and the semiconductor chip 1121 may be mounted on the wiring pattern 1112 through soldering.

As the uppermost insulating layer is excluded from the redistributed layer 1110 as described above, the semiconductor package 1100-3 may reduce the cost and simplify the process compared to forming an insulating layer. Moreover, reliability and durability may be maintained compared to a structure in which the wiring pattern is exposed, such as the semiconductor package 1100 of FIG. 17.

Figure 21:
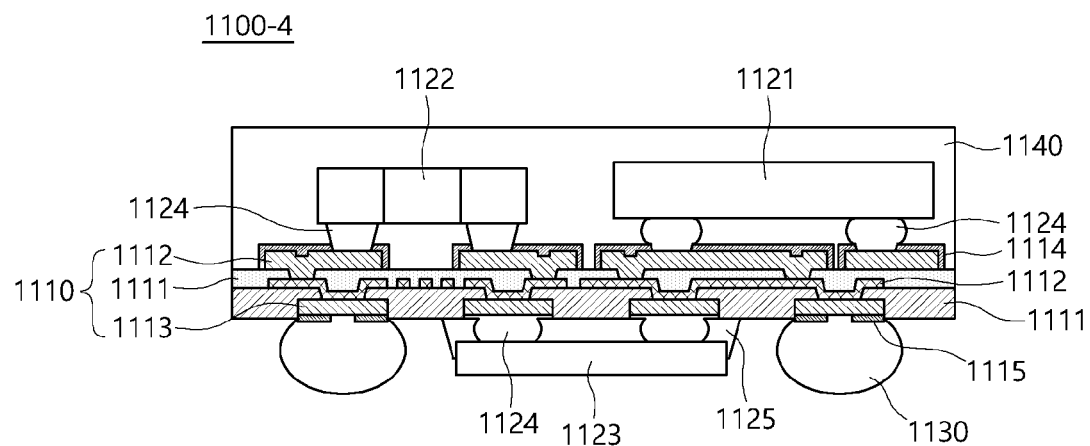
FIG. 21 is a cross-sectional view of a semiconductor package having a single redistributed layer according to the fourth modification example of the present invention.

FIG. 21 is a cross-sectional view of a semiconductor package having a single redistributed layer according to the fourth modification example of the present invention.

Compared to the semiconductor package 1100-3 of the third modification example, the semiconductor package 1100-4 according to the fourth modification example has a structure in which the external connection terminal 1130 is formed on the wiring pattern 1112. Since the constitutions other than the above are the same as those of the semiconductor package 1100-3 of the third modification example, the detailed description thereof will be omitted.

Herein, the semiconductor package 1100-4 according to the fourth modification example is illustrated and described as being based on the semiconductor package 1100-3 of the third modification example, but is not limited thereto, and it may be certainly applied to semiconductor packages according to FIG. 17 and other modification examples.

More specifically, the semiconductor package 1100-4 may include a redistributed layer 1110 from which the lowermost insulating layer 1111 is omitted. That is, the redistributed layer 1110 may include the insulating layer 1111 and the wiring pattern 1112, and a part of the lower wiring pattern 1112 may be exposed below the insulating layer 1111.

In this case, the semiconductor package 1100-4 according to the fourth modification example may include an oxide layer 1114, except for a portion of the wiring pattern 1112 to which the external connection terminal 1130 is connected. Herein, the oxide layer 1114 may be formed by black oxidation.

As such, the semiconductor package 1100-4 may have a structure in which a solder bump is connected while utilizing the wiring pattern 1112.

Accordingly, the semiconductor package 1100-4 may reduce the cost and simplify the process.

Optionally, the semiconductor package 1100-4 according to the fourth modification example may be provided with a UBM layer at a portion of the wiring pattern 1112 to which the external connection terminal 1130 is connected. Herein, the UBM layer may be made of Ni/Au. Accordingly, it is possible to improve the coupling property and conductivity of the external connection terminal 1130. As such, the UBM layer may be certainly applied to semiconductor packages according to other modification examples.

Figure 22:
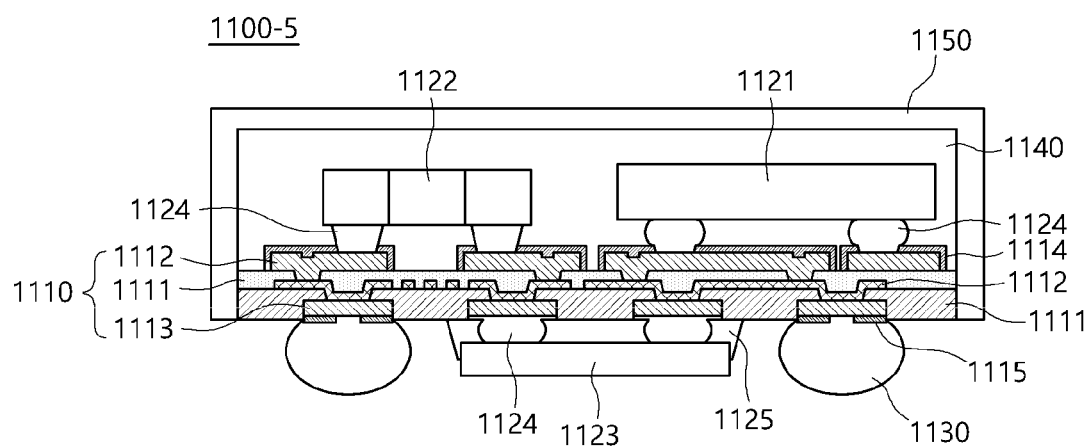
FIG. 22 is a cross-sectional view of a semiconductor package having a single redistributed layer according to the fifth modification example of the present invention.

FIG. 22 is a cross-sectional view of a semiconductor package having a single redistributed layer according to the fifth modification example of the present invention.

Compared to the semiconductor package 1100-3 of the third modification example, the semiconductor package 1100-5 according to the fifth modification example has a structure in which the shield layer 1150 is provided along the outer surface of the mold 1140. Since the constitutions other than the above are the same as those of the semiconductor package 1100-3 of the third modification example, the detailed description thereof will be omitted.

More specifically, the shield layer 1150 may be provided to extend to the side surface of the redistributed layer 1110. The shield layer 1150 may have an EMI shielding function.

For example, the shield layer 1150 may be made of a metal material capable of shielding electromagnetic waves. As another example, the shield layer 1150 may be made of a material capable of absorbing a specific electromagnetic wave. For example, the shield layer 1150 may be made of ferrite.

In this case, the shield layer 1150 may be formed by a sputter process using a metal seed. Optionally, the shield layer 1150 may be formed by the SMT process using a metal can. In addition, the shield layer 1150 may be omitted by configuring the mold 1140 of an electromagnetic wave absorbing material such as ferrite.

Figure 23:
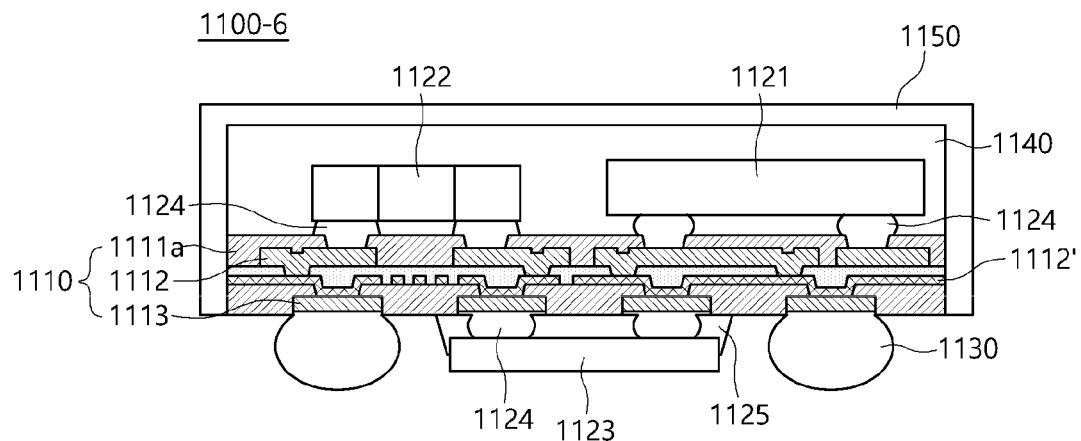
FIG. 23 is a cross-sectional view of a semiconductor package having a single redistributed layer according to the sixth modification example of the present invention.

FIG. 23 is a cross-sectional view of a semiconductor package having a single redistributed layer according to the sixth modification example of the present invention.

Compared to the semiconductor package 1100-2 of the second modification example, the semiconductor package 1100-6 according to the sixth modification example has a structure in which the shield layer 1150 is grounded to the sidewall ground line 1112' of the redistributed layer 1110. Since the constitutions other than the above are the same as those of the semiconductor package 1100-2 of the second modification example, the detailed description thereof will be omitted.

Herein, the semiconductor package 1100-6 according to the sixth modification example is illustrated and described as being based on the semiconductor package 1100-2 of the second modification example, but is not limited thereto, and it may be certainly applied to semiconductor packages according to other modification examples.

More specifically, the wiring pattern 1112 may include a ground line 1112' formed to extend to be connected to the shield layer 1150.

Figure 24:
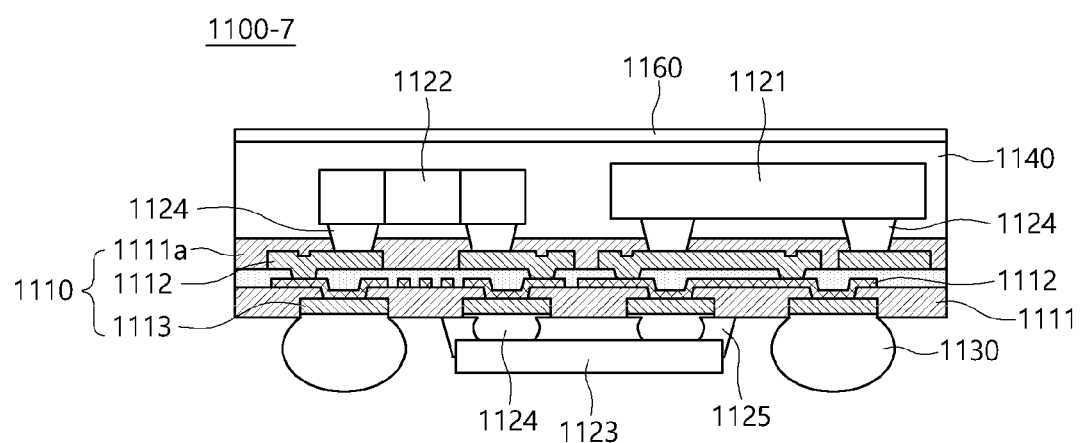
FIG. 24 is a cross-sectional view of a semiconductor package having a single redistributed layer according to the seventh modification example of the present invention.

FIG. 24 is a cross-sectional view of a semiconductor package having a single redistributed layer according to the seventh modification example of the present invention.

Compared to the semiconductor package 1100 of FIG. 17, the semiconductor package 1100-7 according to the seventh modification example has a structure in which a coating layer 1160 is provided on the upper surface of the mold 1140. Since the constitutions other than the above are the same as those of the semiconductor package 1100-1 of FIG. 18, the detailed description thereof will be omitted.

Herein, the semiconductor package 1100-7 according to the seventh modification example is illustrated and described as being based on the semiconductor package 1100-1 of FIG. 18, but is not limited thereto, and it may be certainly applied to semiconductor packages according to other modification examples.

More specifically, the coating layer 1160 may be made of polyimide PI).

Accordingly, the semiconductor package 1100-7 according to the seventh modification may be controlled to reduce warpage of the substrate due to an increase in redistribution, thereby improving handling of the substrate during the manufacturing process.

Figure 25:
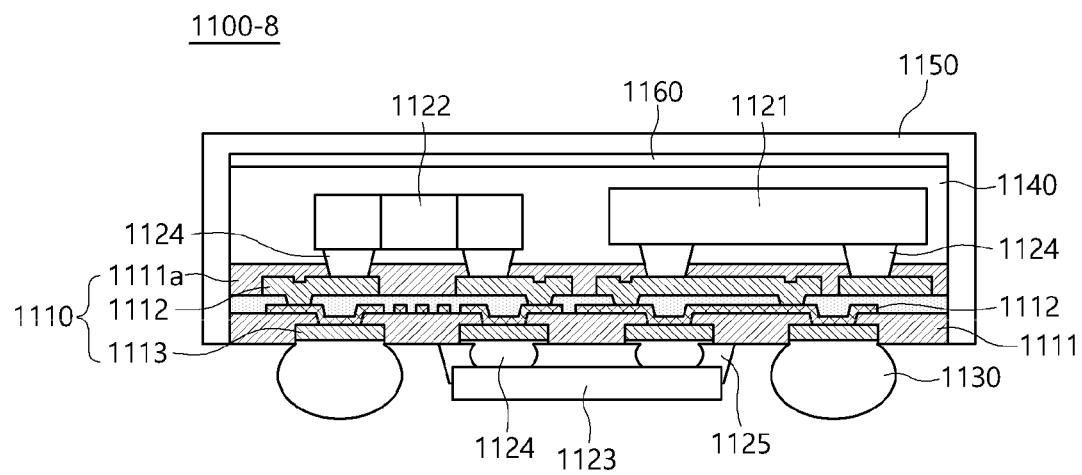
FIG. 25 is a cross-sectional view of a semiconductor package having a single redistributed layer according to the eighth modification example of the present invention.

FIG. 25 is a cross-sectional view of a semiconductor package having a single redistributed layer according to the eighth modification example of the present invention.

Compared to the semiconductor package 1100-7 of the seventh modification example, the semiconductor package 1100-8 according to the eighth modification example has a structure in which the shield layer 1150 is provided along the outer surface of the mold 1140 and the upper surface of the coating layer 1160. Since the constitutions other than the above are the same as those of the semiconductor package 1100-7 of the seventh modification example, the detailed description thereof will be omitted.

Herein, the semiconductor package 1100-8 according to the eighth modification example is illustrated and described as being based on the semiconductor package 1100-7 of the seventh modification example, but is not limited thereto, and it may be certainly applied to semiconductor packages according to other modification examples.

More specifically, the shield layer 1150 may be provided to cover the coating layer 1160 and extend to a side surface of the redistributed layer 1110. The shield layer 1150 may have an EMI shielding function.

For example, the shield layer 1150 may be made of a metal material capable of shielding electromagnetic waves. As another example, the shield layer 1150 may be made of a material capable of absorbing a specific electromagnetic wave. For example, the shield layer 1150 may be made of ferrite.

In this case, the shield layer 1150 may be formed by a sputter process using a metal seed. Optionally, the shield layer 1150 may be formed by the SMT process using a metal can.

During manufacture, the shield layer 1150 may be formed after performing warpage control of the substrate in a state in which the coating layer 1160 is coated on the mold 1140.

Accordingly, the semiconductor package 1100-8 according to the eighth modification may be controlled to reduce warpage of the substrate due to an increase in redistribution, thereby improving handling of the substrate during the manufacturing process.

Figure 26:
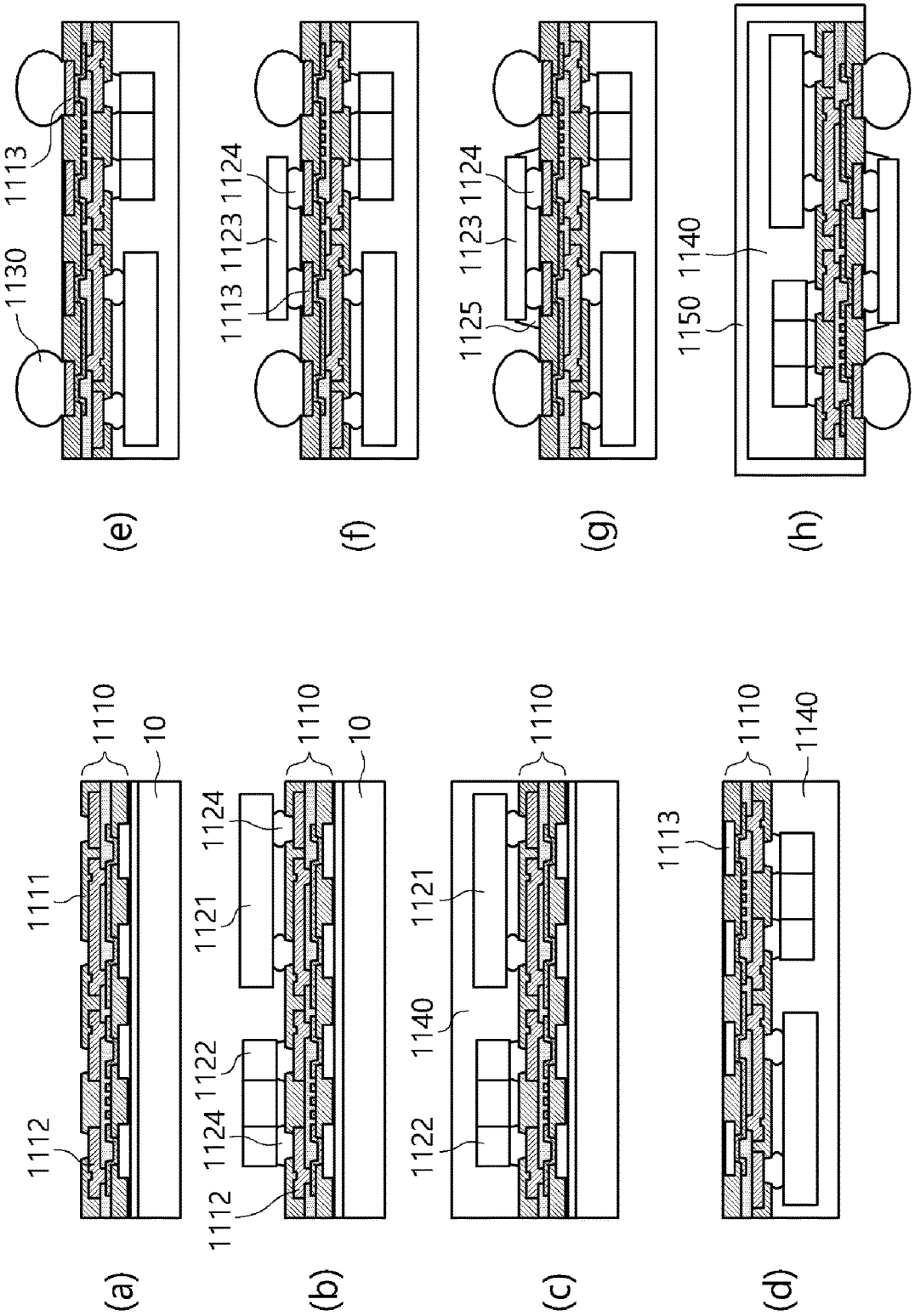
FIG. 26 is a diagram for describing the manufacturing process of a semiconductor package having a single redistributed layer according to an exemplary embodiment of the present invention.

FIG. 26 is a diagram for describing the manufacturing process of a semiconductor package according to an exemplary embodiment of the present invention. Herein, the description of the manufacturing process is based on the semiconductor package 1100-2 of the second modification example.

The manufacturing process of a semiconductor package according to an exemplary embodiment of the present invention may be performed by a chip-first/face-up method of the fan-out wafer level package (FOWLP).

First, a redistributed layer 1110 is formed on a carrier substrate 10 in an ETS structure (refer to (a) of FIG. 26). In this case, the insulating layer 1111 and the wiring pattern 1112 may be configured by two layers. In addition, apart of the wiring pattern 1112 may be formed to be exposed.

The semiconductor chip 1121 and the passive device 1122 are mounted on the redistributed layer 1110 by the SMT process (refer to (b) of FIG. 26). The semiconductor chip 1121 and the passive device 1122 may be mounted on the wiring pattern 1112 exposed through a solder 1124.

A mold 1140 is formed on the redistributed layer 1110 to cover the semiconductor chip 1121 and the passive device 1122 (refer to (c) of FIG. 26). In this case, the mold 1140 may be formed by the vacuum printing encapsulation system (VPES).

The UBM layer 1113 is formed in a state in which the carrier substrate 10 is removed and the redistributed layer 1110 is rotated (refer to (d) of FIG. 26). In this case, the UBM layer 1113 may be formed on one surface (the upper surface in the drawing) of the redistributed layer 1110 by vapor deposition or sputtering.

An external connection terminal 1130 is formed on the UBM layer 1113 (refer to (e) of FIG. 26). In this case, the external connection terminal 1130 may be formed in a ball shape of the SAC-series solder bump.

Optionally, after forming the solder bump, a non-photo-sensitive insulating film may be deposited and then subjected to grinding. Accordingly, the redistributed layer 1110 is prevented from protruding to the outside, thereby improving the reliability of the product.

The semiconductor chip 1123 is mounted in an area in which the external connection terminal 130 is not formed by the SMT process (refer to (f) of FIG. 26). The semiconductor chip 1123 may be mounted on the UBM layer 1113 through a solder 1124.

The underfill layer 1125 is formed between the semiconductor chip 1123 and the redistributed layer 1110 (refer to (g) of FIG. 26). In this case, the underfill layer 1125 may be formed to surround the solder 1124 under the semiconductor chip 1123.

A shield layer 1150 is formed along the outer surface of the mold 1140, while the redistributed layer 1110 is rotated (refer to (h) of FIG. 26). In this case, the shield layer 1150 may be formed by a sputter process using metal sheets. As another example, the shield layer 1150 may be formed by the SMT process using a metal can.

Although exemplary embodiments of the present invention have been described above, the spirit of the present invention is not limited to the exemplary embodiments presented in the present specification, and those skilled in the art who understand the spirit of the present invention will be able to easily propose other exemplary embodiments by supplementing, changing, deleting, or adding components within the scope of the same spirit, but it will be said that these are also within the scope of the spirit of the present invention.

EXPLANATION OF REFERENCE NUMERALS

100, 200, 300: Semiconductor packages
110, 110', 210, 210': Redistributed layers
111, 113: Insulating layers
112, 114, 214: Wiring patterns
212: Metal plate
114': UBM layer
111b: Oxide layer
121, 123, 124, 221, 222: Semiconductor chips
124a: Chip pad
122: Passive device
124, 125: Solders
130: External connection terminal
140, 140, 141: Molds
150: Shield layer
125: Underfill layer
115: 3D via
116: Connection pad
117: Heat dissipation pad

The invention claimed is:

1. A semiconductor package, comprising:
a redistributed layer comprising an insulating layer and a wiring pattern, wherein the insulating layer is not formed on a top surface and side surfaces of the uppermost wiring pattern among the wiring pattern;
a plurality of semiconductor chips disposed on both upper and lower portions of the redistributed layer; and
a mold provided to cover the plurality of semiconductor chips on the upper portion of the redistributed layer,
wherein the redistributed layer is composed of multiple layers including a plurality of insulating layers and a plurality of wiring patterns, and
wherein in the wiring pattern, the thickness of the uppermost wiring pattern or the lowermost wiring pattern is thicker than that of the wiring pattern located between the uppermost wiring pattern and the lowermost wiring pattern such that it is possible to omit an insulating layer covering the uppermost wiring pattern or a UBM under the redistributed layer.

2. The semiconductor package of claim 1, further comprising a coating layer made of polyimide on the upper surface of the mold.

3. The semiconductor package of claim 1, wherein a part of the wiring pattern on the lower side is exposed to the lower side, and
   wherein the uppermost wiring pattern or the lowermost wiring pattern among the wiring patterns is covered with an oxide layer by black oxidation.

4. The semiconductor package of claim 1, further comprising a shield layer provided along the outer surface of the mold.

5. The semiconductor package of claim 4, wherein the redistributed layer is formed to extend such that a part of at least one wiring pattern is connected to the shield layer.

6. The semiconductor package of claim 1, wherein the insulating layer has a dielectric constant (Dk) of 2 to 3 and a dissipation factor of 0.002 to 0.005.

* * * * *